United States Patent
Diep et al.

(10) Patent No.: US 10,008,271 B1
(45) Date of Patent: Jun. 26, 2018

(54) PROGRAMMING OF DUMMY MEMORY CELL TO REDUCE CHARGE LOSS IN SELECT GATE TRANSISTOR

(71) Applicant: SanDisk Technologies LLC, Plano, TX (US)

(72) Inventors: Vinh Diep, San Jose, CA (US); Ching-Huang Lu, Fremont, CA (US); Yingda Dong, San Jose, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days. days.

(21) Appl. No.: 15/693,982

(22) Filed: Sep. 1, 2017

(51) Int. Cl.
| | | |
|---|---|---|
| *G11C 16/10* | (2006.01) | |
| *G11C 16/04* | (2006.01) | |
| G11C 16/30 | (2006.01) | |
| G11C 16/08 | (2006.01) | |
| G11C 7/14 | (2006.01) | |

(52) U.S. Cl.
CPC .......... *G11C 16/10* (2013.01); *G11C 16/0483* (2013.01); *G11C 7/14* (2013.01); *G11C 16/08* (2013.01); *G11C 16/30* (2013.01); *G11C 2213/75* (2013.01)

(58) Field of Classification Search
CPC ..... G11C 16/10; G11C 16/0483; G11C 16/08; G11C 16/30
USPC .................................................. 365/185.17
See application file for complete search history.

(56) References Cited

U.S. PATENT DOCUMENTS

| | | | |
|---|---|---|---|
| 8,004,900 B2 | 8/2011 | Dutta et al. | |
| 8,804,430 B2 | 8/2014 | Lai et al. | |
| 8,908,435 B2 | 12/2014 | Li et al. | |
| 9,236,128 B1 | 1/2016 | Louie et al. | |
| 9,343,159 B2 | 5/2016 | Dong et al. | |
| 9,460,805 B1 | 10/2016 | Pang et al. | |
| 9,711,229 B1* | 7/2017 | Rabkin | G11C 16/16 |
| 2011/0222339 A1* | 9/2011 | Kim | G11C 16/10 365/185.2 |
| 2012/0327715 A1* | 12/2012 | Lee | H01L 27/11551 365/185.17 |

(Continued)

OTHER PUBLICATIONS

U.S. Appl. No. 15/403,710, filed Jan. 11, 2017 by Zhang et al., entitled "Suppressing Disturb of Select Gate Transistors During Erase in Memory."

(Continued)

*Primary Examiner* — Ly D Pham
(74) *Attorney, Agent, or Firm* — Vierra Magen Marcus LLP

(57) ABSTRACT

A memory device and associated techniques for reducing charge loss in a select gate transistor. A dummy memory cell is weakly programmed using a hot electron injection type of disturb to reduce the movement of holes toward the adjacent select gate transistor in a common charge trapping layer. The weak programming can occur in a program loop, e.g., in a transition between a pre-charge phase and a program phase, or in an erase loop, just after the erase of dummy and data memory cells. The weak programming does not involve a time penalty since it is concurrent with other operations. The disturb can be provided by increasing the control gate voltage of the dummy memory cell and/or decreasing the control gate voltage of the select gate transistor.

11 Claims, 20 Drawing Sheets

(56) References Cited

U.S. PATENT DOCUMENTS

2015/0332772 A1\* 11/2015 Kim .................. G11C 16/32
                                              365/185.22
2016/0104533 A1\*  4/2016 Tanzawa ............ G11C 16/0483
                                              365/185.11

OTHER PUBLICATIONS

U.S. Appl. No. 15/621,222, filed Jun. 13, 2017 by Diep et al., entitled "Reducing Select Gate Injection Disturb at the Beginning of an Erase Operation."
U.S. Appl. No. 15/621,215, filed Jun. 13, 2017 by Diep et al., entitled "Channel Pre-Charge to Suppress Disturb of Select Gate Transistors During Erase in Memory."

\* cited by examiner

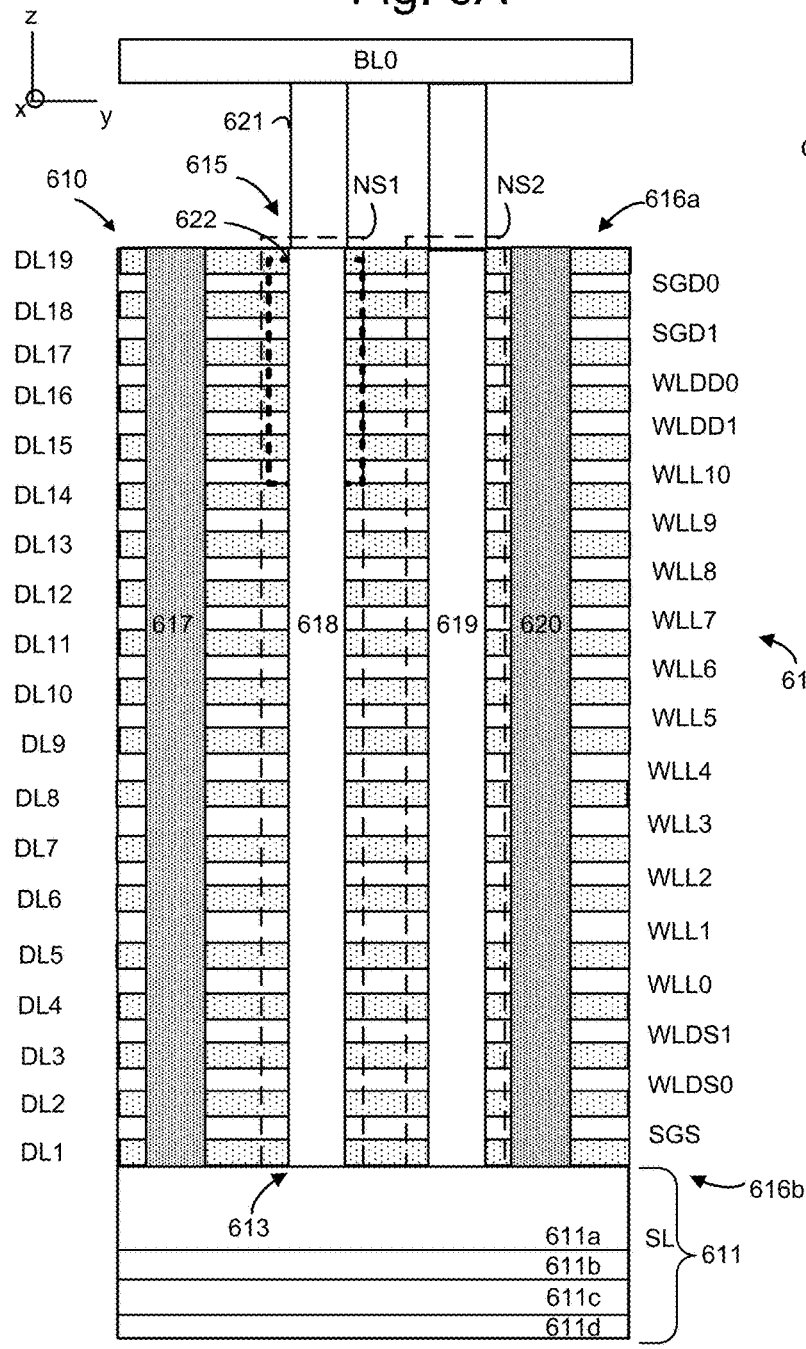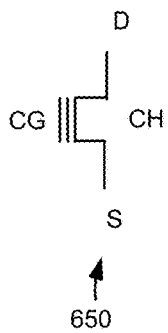

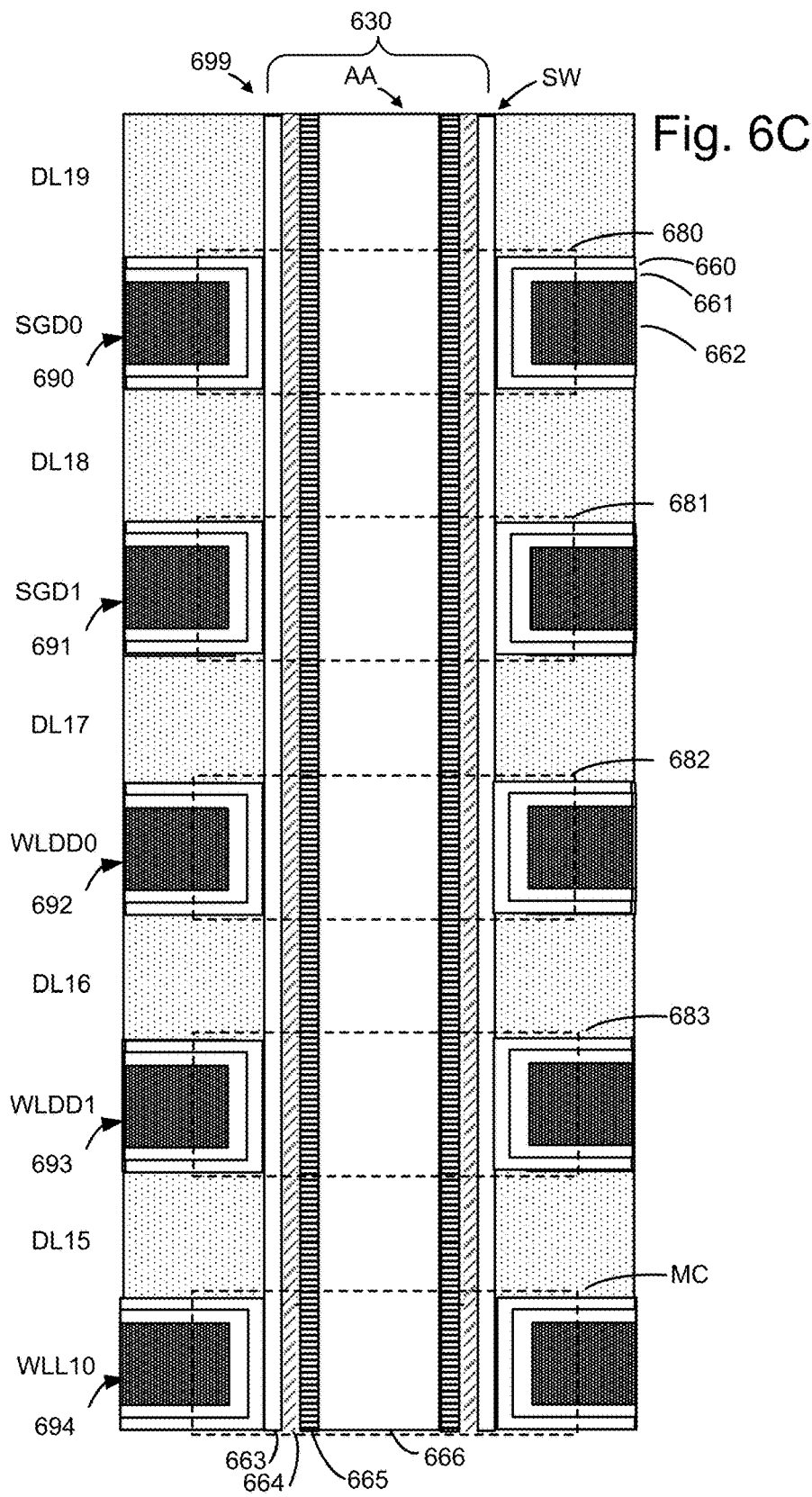

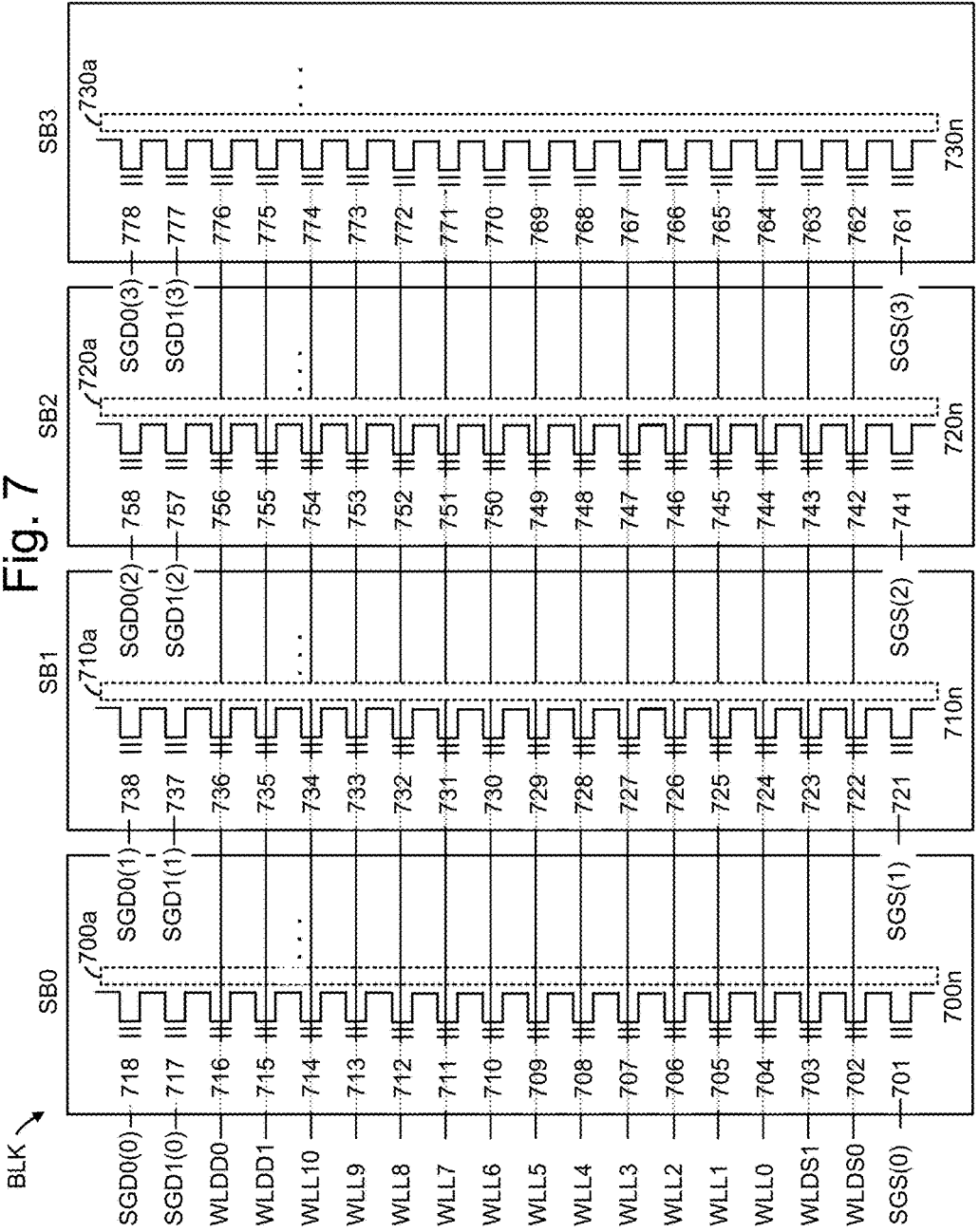

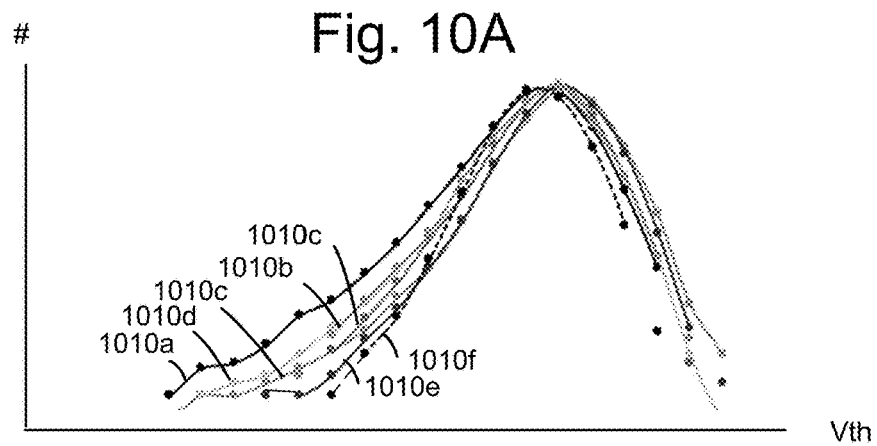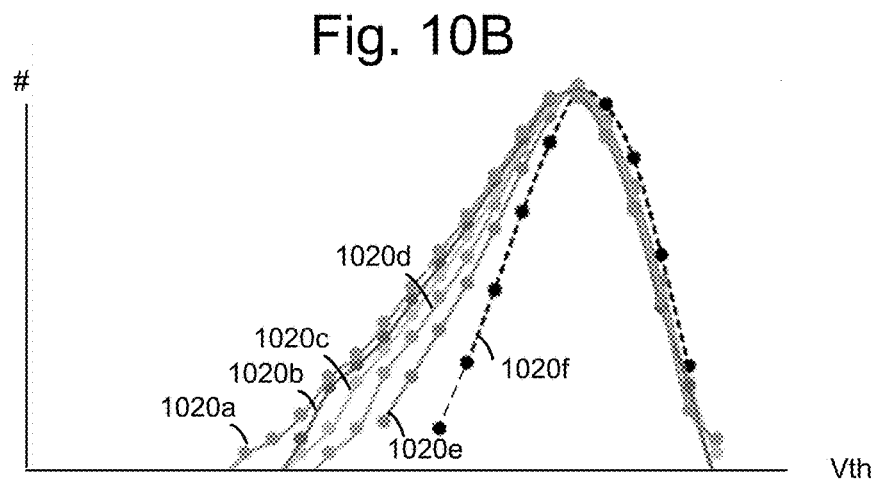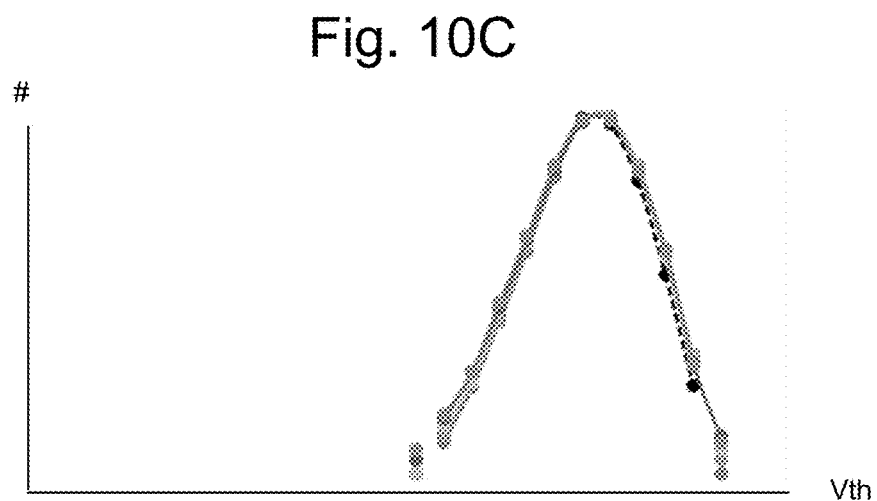

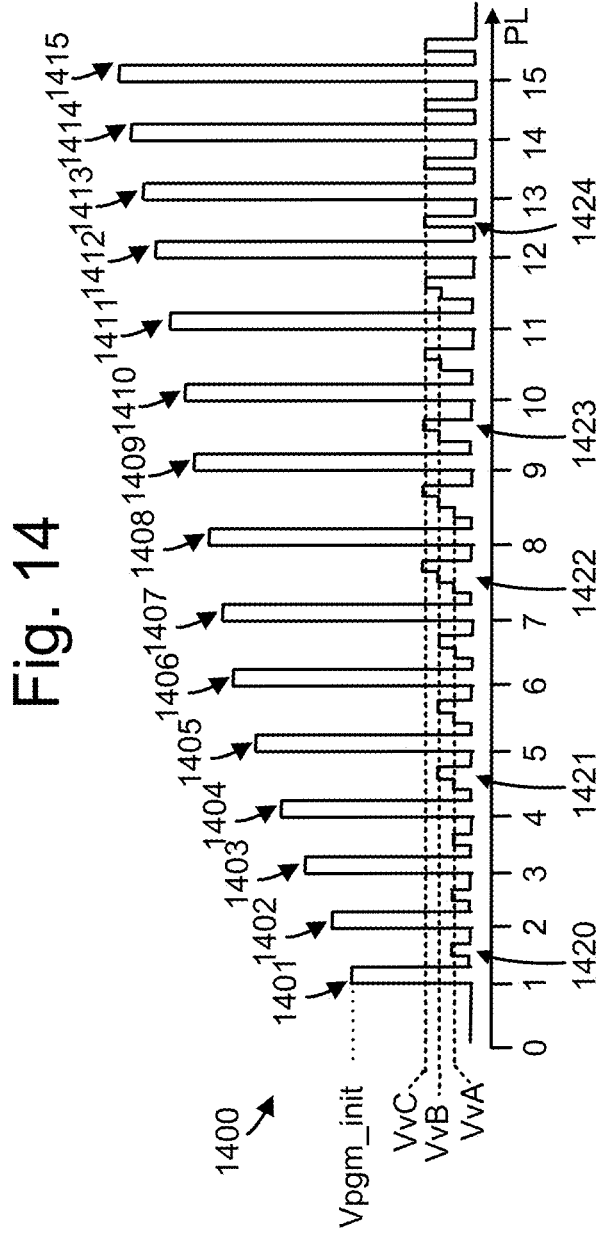

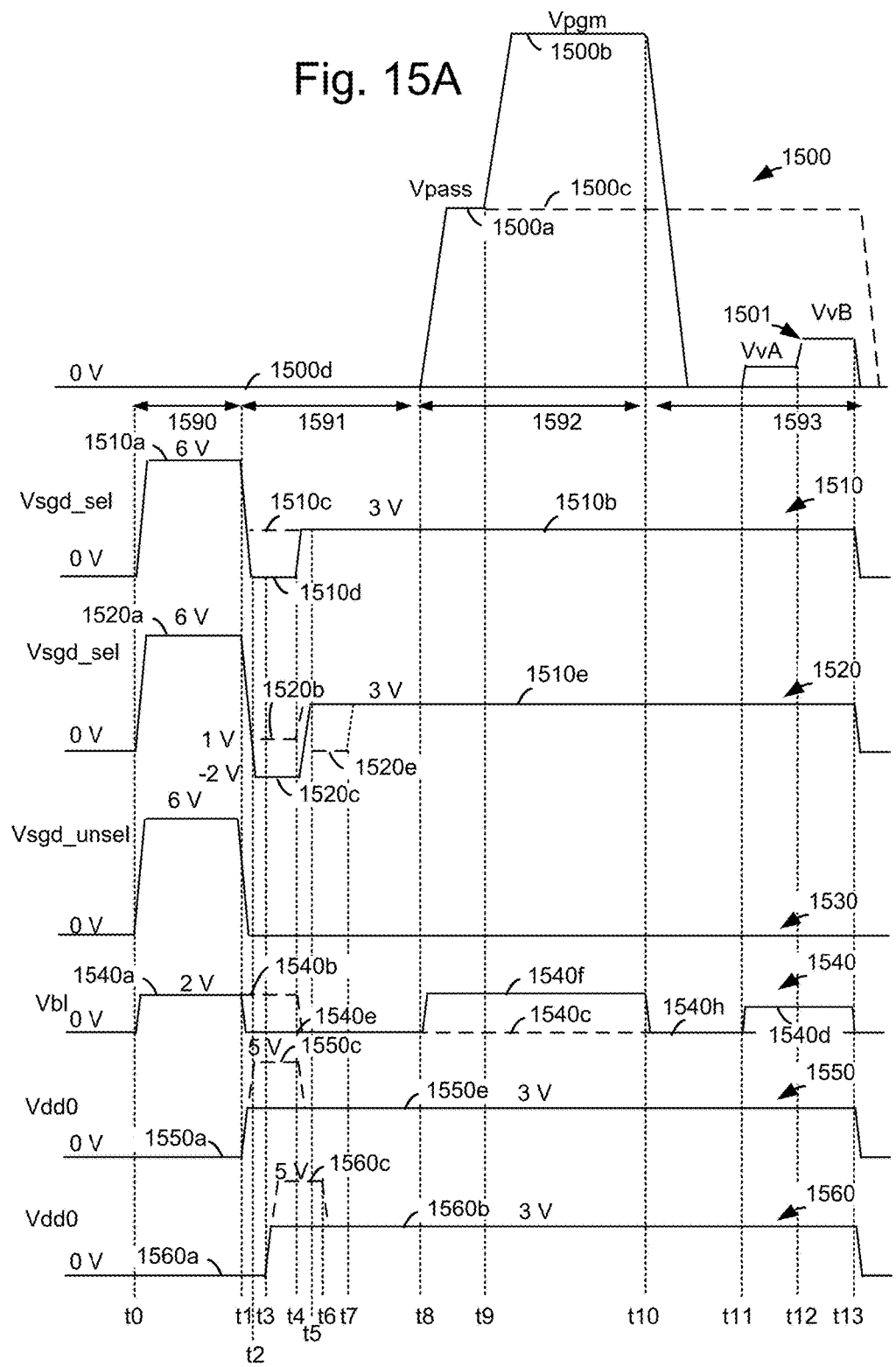

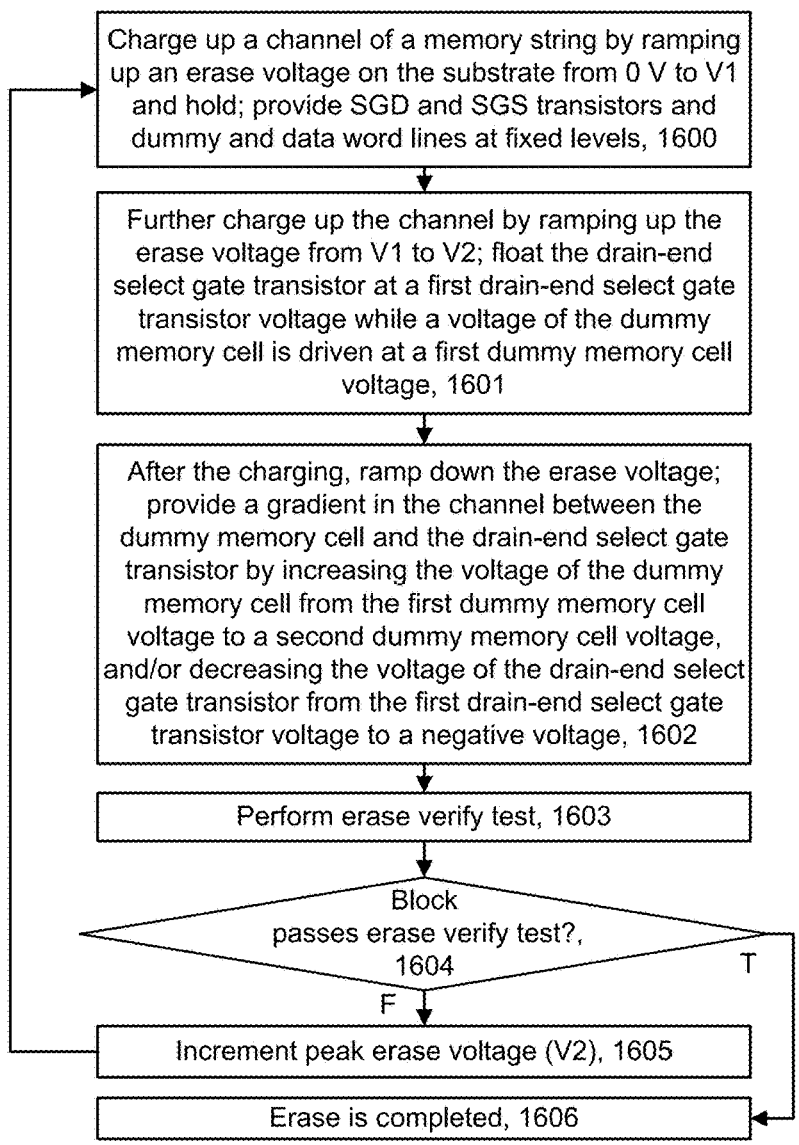

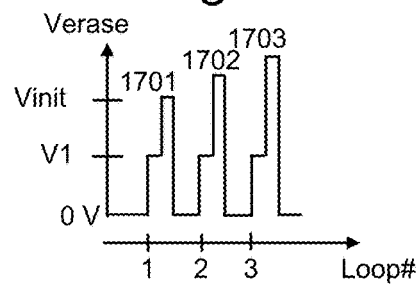
Fig. 17A
Fig. 17B
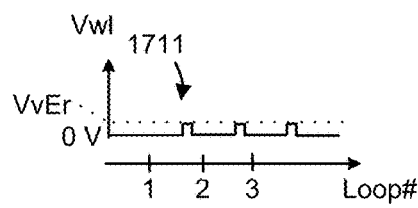
Fig. 18B
| Case | Vdd0 | Vsgd | Vdd0-Vsgd | Vch_dd0 | Vch_sgd | Vch_dd0-Vch_sgd |
|------|------|------|-----------|---------|---------|-----------------|
| 1 | 4 V | -2 V | 6 V | 4-1=3 V | -2-2=-4 V | 7 V |
| 2 | 4 V | 0 V | 4 V | 4-1=3 V | 0-2=-2 V | 5 V |
| 3 | 2 V | -2 V | 4 V | 2-1=1 V | -2-2=-4 V | 5 V |
| 4 | 2 V | 0 V | 2 V | 2-1=1 V | 0-2=-2 V | 3 V |

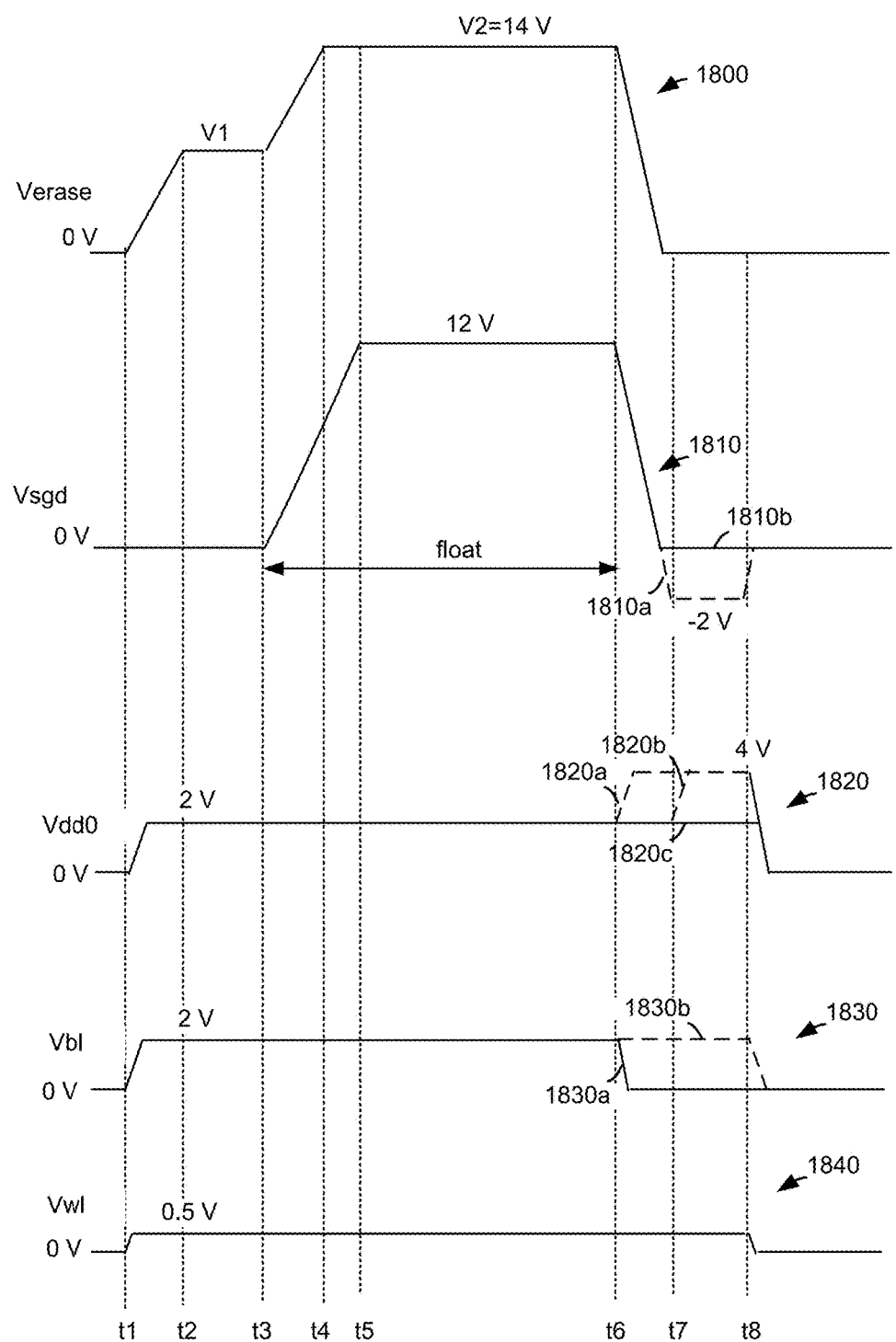

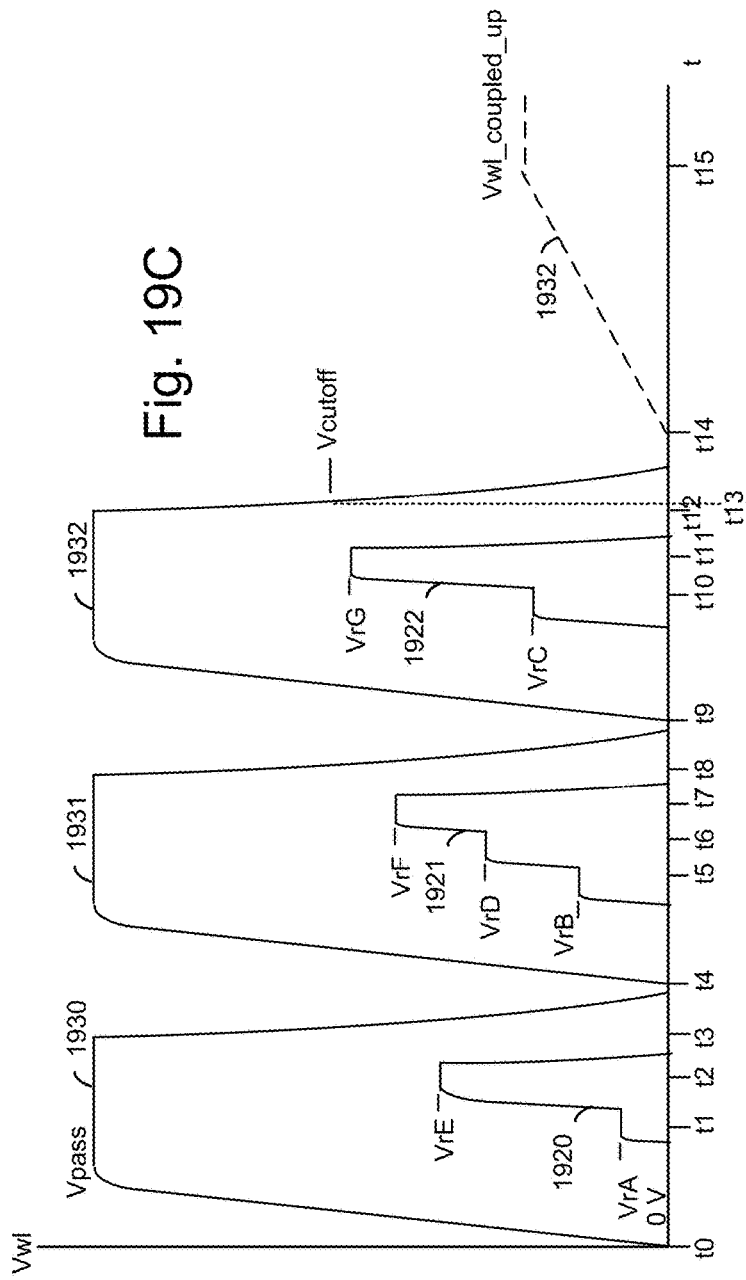
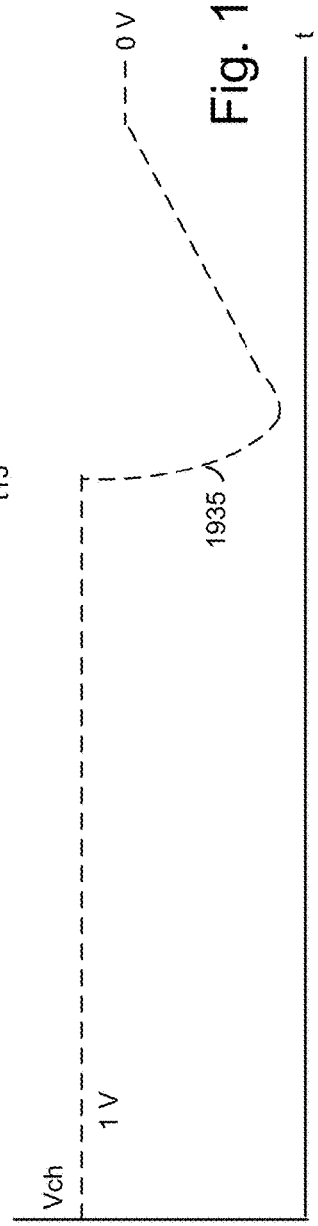
Fig. 19C
Fig. 19D

_US 10,008,271 B1_

PROGRAMMING OF DUMMY MEMORY CELL TO REDUCE CHARGE LOSS IN SELECT GATE TRANSISTOR

BACKGROUND

The present technology relates to the operation of memory devices.

Semiconductor memory devices have become more popular for use in various electronic devices. For example, non-volatile semiconductor memory is used in cellular telephones, digital cameras, personal digital assistants, mobile computing devices, non-mobile computing devices and other devices.

A charge-storing material such as a floating gate or a charge-trapping material can be used in such memory devices to store a charge which represents a data state. A charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers.

A memory device includes memory cells which may be arranged in memory strings, for instance, where select gate transistors are provided at the ends of the memory string to selectively connect a channel of the memory string to a source line or bit line. However, various challenges are presented in operating such memory devices.

BRIEF DESCRIPTION OF THE DRAWINGS

FIG. 6A depicts an example cross-sectional view of a portion of one of the blocks of FIG. 5.

FIG. 6B depicts an example transistor 650.

FIG. 6C depicts a close-up view of the region 622 of the stack of FIG. 6A.

FIG. 7 depicts an example view of NAND strings in sub-blocks in a 3D configuration which is consistent with FIG. 6A.

FIG. 10A depicts a threshold voltage distribution of select gate transistors based on a repeated cycle of: erase, program, read and delay, showing how the distribution is downshifted less when the dummy memory cells are more programmed.

FIG. 10B depicts a threshold voltage distribution of select gate transistors based on a repeated cycle of: erase and delay, for different numbers of cycles.

FIG. 10C depicts a threshold voltage distribution of select gate transistors based on a repeated cycle of: erase, programming of dummy memory cells and delay, for different numbers of cycles.

FIG. 14 depicts a series of program loops in an example programming operation, consistent with FIG. 13A.

FIG. 15A depicts plots of various voltages used in a programming operation consistent with FIG. 13A.

FIG. 15B depicts a table of voltages consistent with FIG. 15A.

FIG. 16 depicts a process for erasing memory cells in which dummy memory cells are programmed due to a disturb during a transition at an end of the erase operation.

FIG. 17A depicts a plot of example erase voltages applied to a substrate in an erase operation consistent with FIG. 16.

FIG. 17B depicts a plot of verify voltages applied to word lines in a block, consistent with the example of FIG. 17A.

FIG. 18A depicts plots of various voltages used in an erase operation consistent with FIG. 16.

FIG. 18B depicts a table of voltages consistent with FIG. 18A.

FIG. 19C depicts a plot of example waveforms in a read operation, showing coupling up of a word line voltage.

FIG. 19D depicts a plot of a channel voltage (Vch) corresponding to FIG. 19C.

DETAILED DESCRIPTION

Figure 1:
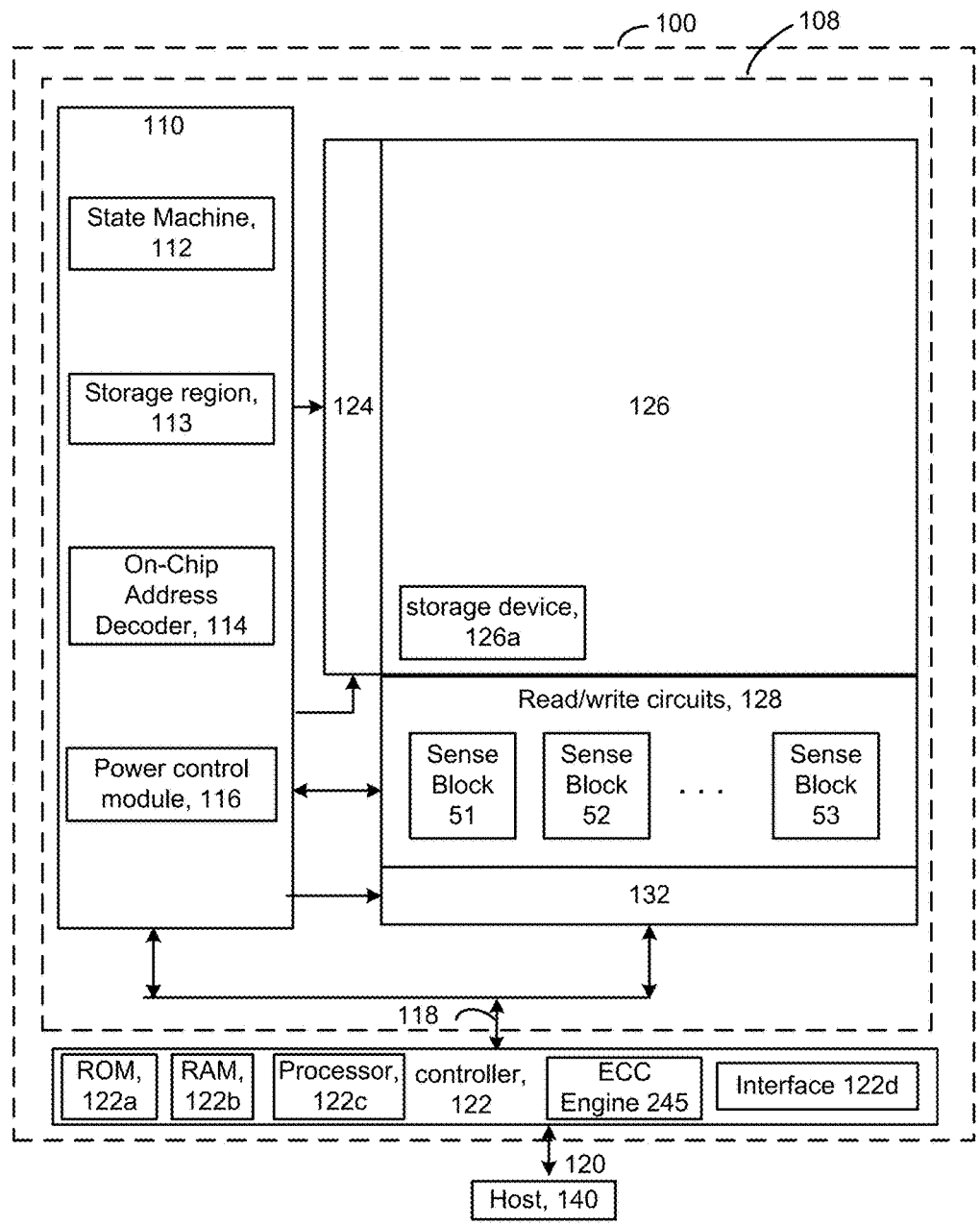
FIG. 1 is a block diagram of an example memory device.

Apparatuses and techniques are described for reducing charge loss in a select gate transistor in a memory device.

In some memory devices, memory cells are joined to one another such as in NAND strings in a block or sub-block. Each NAND string comprises a number of memory cells connected in series between one or more drain-end select gate transistors (referred to as SGD transistors), on a drain-end of the NAND string which is connected to a bit line, and one or more source-end select gate transistors (referred to as SGS transistors), on a source-end of the NAND string or other memory string which is connected to a source line. Further, the memory cells can be arranged with a common control gate line (e.g., word line) which acts a control gate. A set of word lines extends from the source side of a block to the drain side of a block. Memory cells can be connected in other types of strings and in other ways as well.

In a 3D memory structure, the memory cells may be arranged in vertical memory strings in a stack, where the stack comprises alternating conductive and dielectric layers. The conductive layers act as word lines which are connected to the memory cells. Each memory string may have the shape of a pillar which intersects with the word lines to form the memory cells.

The memory cells can include data memory cells, which are eligible to store user data, and dummy or non-data memory cells which are ineligible to store user data. A dummy word line is connected to a dummy memory cell. One or more dummy memory cells may be provided at the drain and/or source ends of a string of memory cells to provide a gradual transition in the channel voltage gradient.

During a programming operation, the memory cells are programmed according to a word line programming order. For example, the programming may start at the word line at the source side of the block and proceed to the word line at the drain side of the block. In one approach, each word line is completely programmed before programming a next word line. For example, a first word line, WL0, is programmed using one or more programming passes until the programming is completed. Next, a second word line, WL1, is programmed using one or more programming passes until the programming is completed, and so forth. A programming pass may include a set of increasing program voltages which are applied to the word line in respective program loops or program-verify iterations, such as depicted in FIG. 14. Verify operations may be performed after each program voltage to determine whether the memory cells have completed programming. When programming is completed for a memory cell, it can be locked out from further programming while programming continues for other memory cells in subsequent program loops.

The memory cells may also be programmed according to a sub-block programming order, where memory cells connected to a word line are programmed in one sub-block, then a next sub-block and so forth.

Each memory cell may be associated with a data state according to write data in a program command. Based on its data state, a memory cell will either remain in the erased state or be programmed to a programmed data state. For example, in a one bit per cell memory device, there are two data states including the erased state and the programmed state. In a two-bit per cell memory device, there are four data states including the erased state and three higher data states referred to as the A, B and C data states (see FIG. 11). In a three-bit per cell memory device, there are eight data states including the erased state and seven higher data states referred to as the A, B, C, D, E, F and G data states (see FIG. 12). In a four-bit per cell memory device, there are sixteen data states including the erased state and fifteen higher data states. The data states may be referred to as the S0-S15 data states where S0 is the erased state.

After the memory cells are programmed, the data can be read back in a read operation. A read operation can involve applying a series of read voltages to a word line while sensing circuitry determines whether cells connected to the word line are in a conductive or non-conductive state. If a cell is in a non-conductive state, the Vth of the memory cell exceeds the read voltage. The read voltages are set at levels which are expected to be between the threshold voltage levels of adjacent data states. During the read operation, the voltages of the unselected word lines are ramped up to a read pass level which is high enough to place the unselected memory cells in a strongly conductive state, to avoid interfering with the sensing of the selected memory cells.

To ensure proper program, erase and read operations in a memory string, the Vth of the SGD transistor should be in a specified range. However, it has been observed that the Vth can decrease over time. See FIGS. 10A and 10B. Specifically, when a charge-trapping region extends in the memory string between the SGD transistor and the dummy memory cell, holes can move from the dummy memory cell to the SGD transistor and combine with electrons in the SGD transistor, reducing the Vth. Tests indicate that an increase in the Vth of the dummy memory cell can reduce or avoid the decrease in the Vth of the SGD transistor. See FIG. 10C.

One possible solution is to erase the dummy memory cell to a shallower depth so that its Vth is higher. However, this can alter the erase depths of the data memory cells due to a reduced current in the string during the erase-verify test. Another possible solution is to perform a separate programming operation for the dummy memory cell after a block is erased. However, this requires additional time.

Techniques provided herein address the above and other issues. In one aspect, the dummy memory cell is weakly programmed by hot electron injection (HEI) type of a disturb. In this case, a channel gradient between the dummy memory cell and the SGD transistor generates electron-hole pairs in which electrons can be injected into the charge trapping layer of the dummy memory cell. In one aspect, the weak programming occurs in a program loop, during the programming of data memory cells. In another aspect, the weak programming occurs in an erase loop, just after the erase of dummy and data memory cells. The weak programming does not involve a time penalty since it is concurrent with other operations.

The channel gradient between the dummy memory cell and the SGD transistor can be increased by increasing the control gate voltage of the dummy memory cell and/or decreasing the control gate voltage of the SGD transistor.

These and other features are discussed further below.

FIG. 1 is a block diagram of an example memory device. The memory device 100, such as a non-volatile storage system, may include one or more memory die 108. The memory die 108 includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks 51, 52, . . . 53 (sensing circuitry) and allow a page of memory cells to be read or programmed in parallel. Typically a controller 122 is included in the same memory device 100 (e.g., a removable storage card) as the one or more memory die 108. The controller may be separate from the memory die. Commands and data are transferred between the host 140 and controller 122 via a data bus 120, and between the controller and the one or more memory die 108 via lines 118.

The memory structure can be 2D or 3D. The memory structure may comprise one or more array of memory cells including a 3D array. The memory structure may comprise a monolithic 3D memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, an on-chip address decoder 114 and a power control module 116. The state machine 112 provides chip-level control of memory operations. A storage region 113 may be provided, e.g., for operational parameters and software/code. In one embodiment, the state machine is programmable by the software. In other embodiments, the state machine does not use software and is completely implemented in hardware (e.g., electrical circuits).

The on-chip address decoder 114 provides an address interface between that used by the host or a memory controller to the hardware address used by the decoders 124 and 132. The power control module 116 controls the power and voltages supplied to the word lines, select gate lines, bit lines and source lines during memory operations. It can include drivers for word lines, SGS and SGD transistors and source lines. See also FIG. 4. The sense blocks can include bit line drivers, in one approach.

In some implementations, some of the components can be combined. In various designs, one or more of the components (alone or in combination), other than memory structure 126, can be thought of as at least one control circuit which is configured to perform the techniques described herein including the steps of the processes described herein. For example, a control circuit may include any one of, or a combination of, control circuitry 110, state machine 112, decoders 114 and 132, power control module 116, sense blocks 51, 52, . . . , 53, read/write circuits 128, controller 122, and so forth.

The off-chip controller 122 (which in one embodiment is an electrical circuit) may comprise a processor 122*c*, storage devices (memory) such as ROM 122*a* and RAM 122*b* and an error-correction code (ECC) engine 245. The ECC engine can correct a number of read errors.

A memory interface 122*d* may also be provided. The memory interface, in communication with ROM, RAM and processor, is an electrical circuit that provides an electrical interface between controller and memory die. For example, the memory interface can change the format or timing of signals, provide a buffer, isolate from surges, latch I/O and so forth. The processor can issue commands to the control circuitry 110 (or any other component of the memory die) via the memory interface 122*d*.

The storage device comprises code such as a set of instructions, and the processor is operable to execute the set of instructions to provide the functionality described herein. Alternatively or additionally, the processor can access code from a storage device 126*a* of the memory structure, such as a reserved area of memory cells in one or more word lines.

For example, code can be used by the controller to access the memory structure such as for programming, read and erase operations. The code can include boot code and control code (e.g., a set of instructions). The boot code is software that initializes the controller during a booting or startup process and enables the controller to access the memory structure. The code can be used by the controller to control one or more memory structures. Upon being powered up, the processor 122*c* fetches the boot code from the ROM 122*a* or storage device 126*a* for execution, and the boot code initializes the system components and loads the control code into the RAM 122*b*. Once the control code is loaded into the RAM, it is executed by the processor. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below, and provide the voltage waveforms including those discussed further below. A control circuit can be configured to execute the instructions to perform the functions described herein.

In one embodiment, the host is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a 2D memory structure or a 3D memory structure.

In a 2D memory structure, the semiconductor memory elements are arranged in a single plane or a single memory device level. Typically, in a 2D memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A 3D memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a 3D memory structure may be vertically arranged as a stack of multiple 2D memory device levels. As another non-limiting example, a 3D memory array may be arranged as multiple vertical columns (e.g., columns extending substantially perpendicular to the major surface of the substrate, i.e., in the y direction) with each column having multiple memory elements. The columns may be arranged in a 2D configuration, e.g., in an x-y plane, resulting in a 3D arrangement of memory elements with elements on multiple vertically stacked memory planes. Other configurations of memory elements in three dimensions can also constitute a 3D memory array.

By way of non-limiting example, in a 3D NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other 3D configurations can be envisioned wherein some NAND strings contain memory elements in a single memory level while other strings contain memory elements which span through multiple memory levels. 3D memory arrays may also be designed in a NOR configuration and in a ReRAM configuration.

Typically, in a monolithic 3D memory array, one or more memory device levels are formed above a single substrate. Optionally, the monolithic 3D memory array may also have one or more memory layers at least partially within the single substrate. As a non-limiting example, the substrate may include a semiconductor such as silicon. In a monolithic 3D array, the layers constituting each memory device level of the array are typically formed on the layers of the underlying memory device levels of the array. However, layers of adjacent memory device levels of a monolithic 3D memory array may be shared or have intervening layers between memory device levels.

2D arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic 3D memory arrays. Further, multiple 2D memory arrays or 3D memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the 2D and 3D exemplary structures described but covers all relevant memory structures within the spirit and scope of the technology as described herein and as understood by one of skill in the art.

Figure 2:
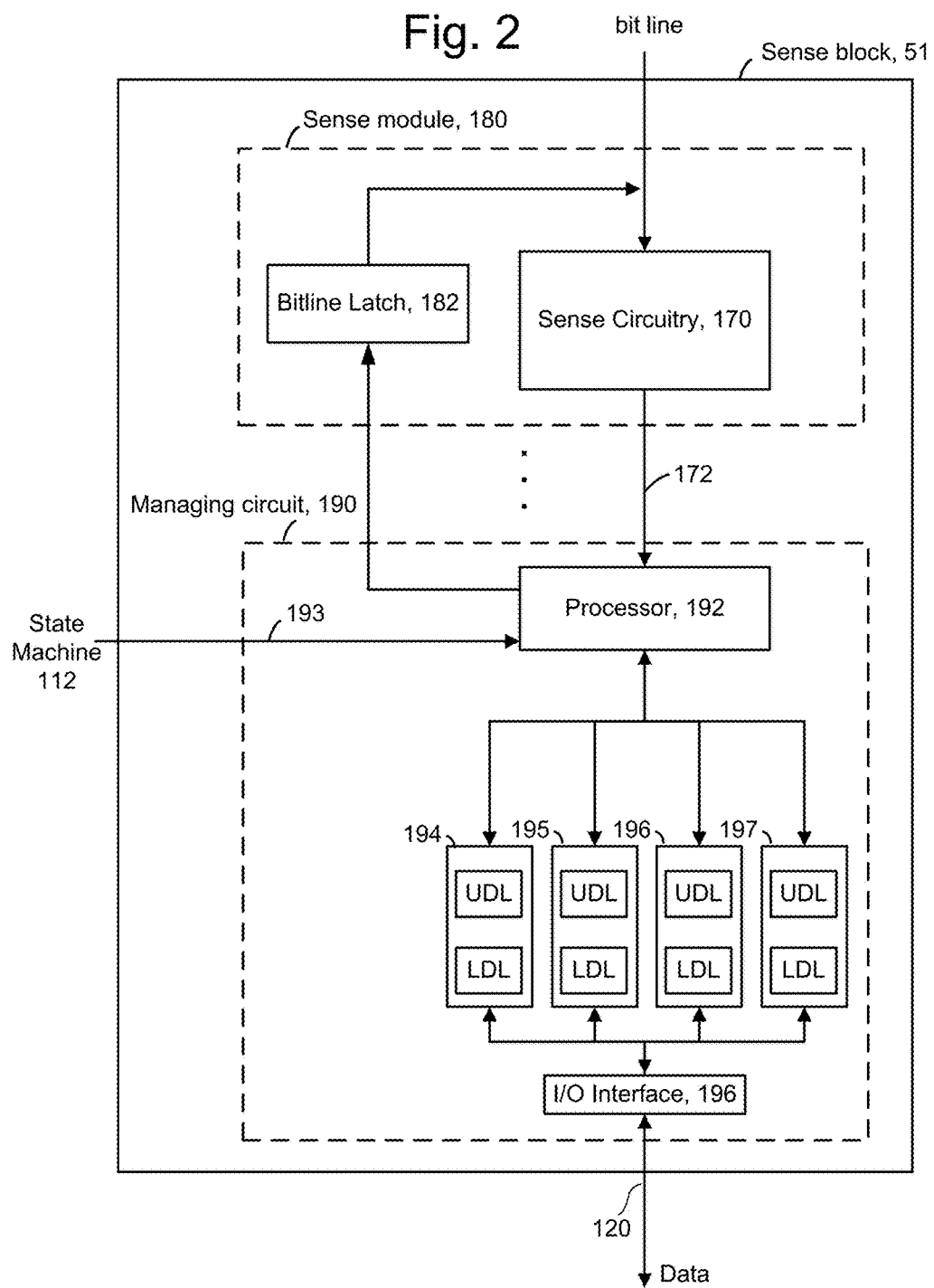
FIG. 2 is a block diagram depicting one embodiment of the sense block 51 of FIG. 1.

FIG. 2 is a block diagram depicting one embodiment of the sense block 51 of FIG. 1. An individual sense block 51 is partitioned into one or more core portions, referred to as sense modules 180 or sense amplifiers, and a common portion, referred to as a managing circuit 190. In one embodiment, there will be a separate sense module 180 for each bit line and one common managing circuit 190 for a set of multiple, e.g., four or eight, sense modules 180. Each of the sense modules in a group communicates with the associated managing circuit via data bus 172. Thus, there are one or more managing circuits which communicate with the sense modules of a set of storage elements.

Sense module 180 comprises sense circuitry 170 that performs sensing by determining whether a conduction current in a connected bit line is above or below a predetermined threshold level. Sense module 180 also includes a bit line latch 182 that is used to set a voltage condition on the connected bit line. For example, a predetermined state latched in bit line latch 182 will result in the connected bit line being pulled to a state designating program inhibit (e.g., 1.5-3 V). As an example, a flag=0 can inhibit programming, while flag=1 does not inhibit programming.

Managing circuit 190 comprises a processor 192, four example sets of data latches 194-197 and an I/O Interface 196 coupled between the set of data latches 194 and data bus 120. One set of data latches can be provide for each sense module, and data latches identified by LDL and UDL may be provided for each set. In some cases, additional data latches may be used. LDL stores a bit for a lower page of data, and UDL stores a bit for an upper page of data. This is in a four-level or two-bits per storage element memory device. One additional data latch per bit line can be provided for each additional data bit per storage element.

Processor 192 performs computations, such as to determine the data stored in the sensed storage element and store the determined data in the set of data latches. Each set of data latches 194-197 is used to store data bits determined by processor 192 during a read operation, and to store data bits imported from the data bus 120 during a programming operation which represent write data meant to be programmed into the memory. I/O interface 196 provides an interface between data latches 194-197 and the data bus 120.

During reading, the operation of the system is under the control of state machine 112 that controls the supply of different control gate voltages to the addressed storage element. As it steps through the various predefined control gate voltages corresponding to the various memory states supported by the memory, the sense module 180 may trip at one of these voltages and a corresponding output will be provided from sense module 180 to processor 192 via bus 172. At that point, processor 192 determines the resultant memory state by consideration of the tripping event(s) of the sense module and the information about the applied control gate voltage from the state machine via input lines 193. It then computes a binary encoding for the memory state and stores the resultant data bits into data latches 194-197. In another embodiment of the managing circuit 190, bit line latch 182 serves double duty, both as a latch for latching the output of the sense module 180 and also as a bit line latch as described above.

Some implementations can include multiple processors 192. In one embodiment, each processor 192 will include an output line (not depicted) such that each of the output lines is wired-OR'd together. In some embodiments, the output lines are inverted prior to being connected to the wired-OR line. This configuration enables a quick determination during the program verification process of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense modules, the state machine needs to read the wired-OR line eight times, or logic is added to processor 192 to accumulate the results of the associated bit lines such that the state machine need only read the wired-OR line one time. Similarly, by choosing the logic levels correctly, the global state machine can detect when the first bit changes its state and change the algorithms accordingly.

During program or verify operations, the data to be programmed (write data) is stored in the set of data latches 194-197 from the data bus 120, in the LDL and UDL latches, in a two-bit per storage element implementation. In a three-bit per storage element implementation, an additional data latch may be used. The programming operation, under the control of the state machine, comprises a series of programming voltage pulses applied to the control gates of the addressed storage elements. Each program pulse is followed by a read back (verify) to determine if the storage element has been programmed to the desired memory state. In some cases, processor 192 monitors the read back memory state relative to the desired memory state. When the two are in agreement, the processor 192 sets the bit line latch 182 so as to cause the bit line to be pulled to a state designating program inhibit. This inhibits the storage element coupled to the bit line from further programming even if program pulses appear on its control gate. In other embodiments the processor initially loads the bit line latch 182 and the sense circuitry sets it to an inhibit value during the verify process.

Each set of data latches 194-197 may be implemented as a stack of data latches for each sense module. In one embodiment, there are three data latches per sense module 180. In some implementations, the data latches are implemented as a shift register so that the parallel data stored therein is converted to serial data for data bus 120, and vice versa. All the data latches corresponding to the read/write block of storage elements can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

The data latches identify when an associated storage element has reached certain mileposts in a programming operations. For example, latches may identify that a storage element's Vth is below a particular verify level. The data latches indicate whether a storage element currently stores one or more bits from a page of data. For example, the LDL latches can be used to store a lower page of data. An LDL latch is flipped (e.g., from 0 to 1) when a lower page bit is stored in an associated storage element. A UDL latch is flipped when an upper page bit is stored in an associated storage element. This occurs when an associated storage element completes programming, e.g., when its Vth exceeds a target verify level such as VvA, VvB or VvC.

Figure 3:
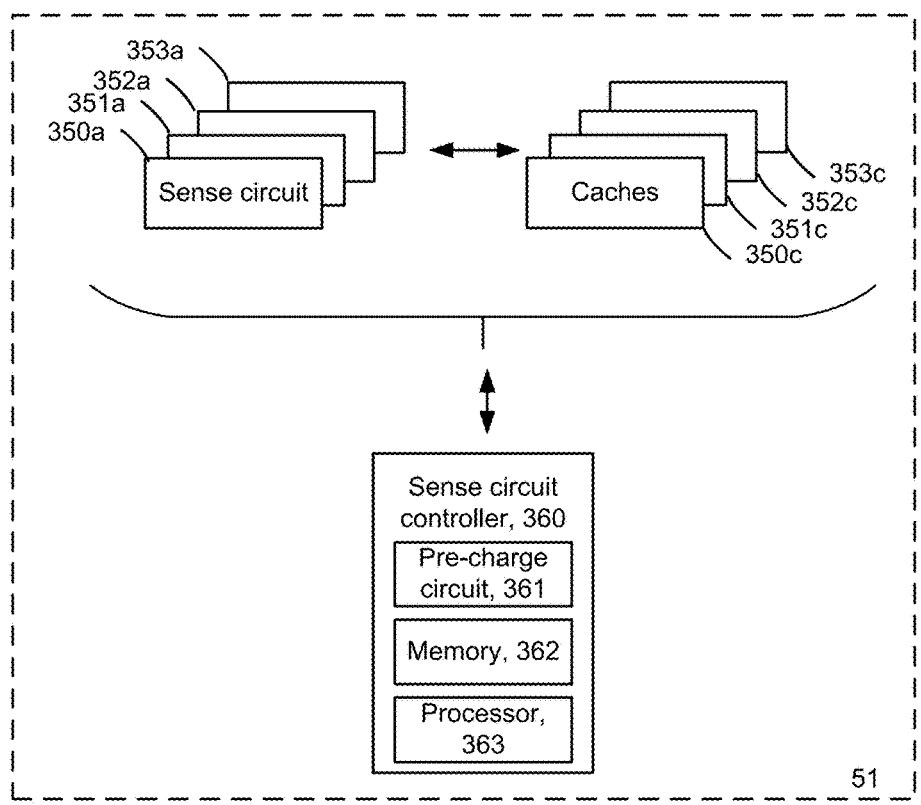
FIG. 3 depicts another example block diagram of the sense block 51 of FIG. 1.

FIG. 3 depicts another example block diagram of the sense block 51 of FIG. 1. The column control circuitry can include multiple sense blocks, where each sense block performs sensing, e.g., read, program verify or erase verify operations for multiple memory cells via respective bit lines. In one approach, a sense block comprises multiple sense circuits, also referred to as sense amplifiers. Each sense circuit is associated with data latches and caches. For example, the example sense circuits 350a, 351a, 352a and 353a are associated with caches 350c, 351c, 352c and 353c, respectively.

In one approach, different subsets of bit lines can be sensed using different respective sense blocks. This allows the processing load which is associated with the sense circuits to be divided up and handled by a respective processor in each sense block. For example, a sense circuit controller 360 can communicate with the set, e.g., sixteen, of sense circuits and latches. The sense circuit controller may include a pre-charge circuit 361 which provides a voltage to each sense circuit for setting a pre-charge voltage. The sense circuit controller may also include a memory 362 and a processor 363.

Figure 4:
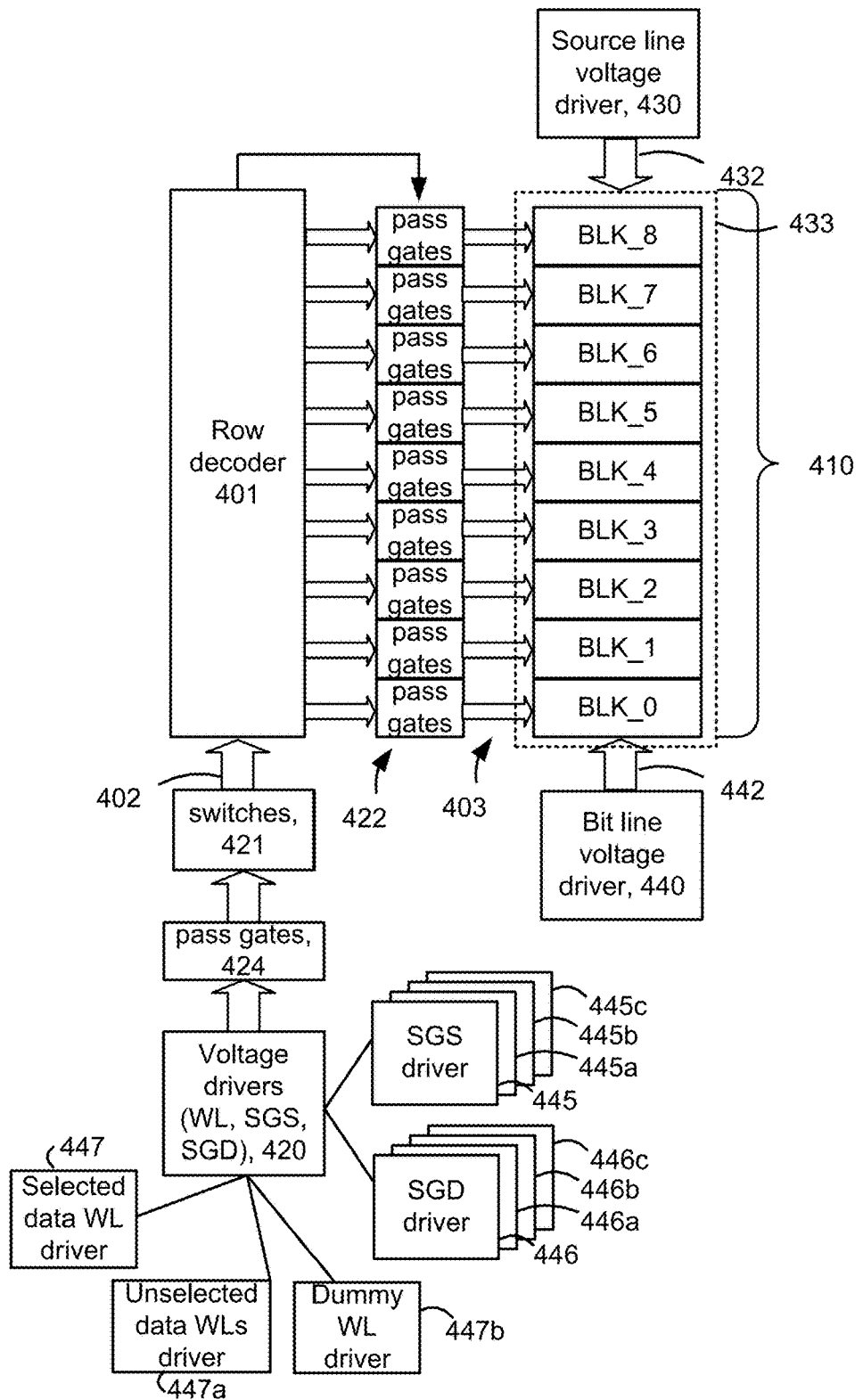
FIG. 4 depicts an example circuit for providing voltages to blocks of memory cells.

FIG. 4 depicts an example circuit for providing voltages to blocks of memory cells. In this example, a row decoder 401 provides voltages to word lines and select gates of each block in set of blocks 410. The set could be in a plane and includes blocks BLK_0 to BLK_8. The row decoder provides a control signal to pass gates 422 which connect the blocks to the row decoder. Typically, operations, e.g., program, read or erase, are performed on one selected block at a time. The row decoder can connect global control lines 402 to local control lines 403. The control lines represent conductive paths. Voltages are provided on the global control lines from voltage drivers 420. The voltage sources or drivers may provide voltages to switches 421 which connect to the global control lines. Pass gates 424 are controlled to pass voltages from the voltage drivers 420 to the switches 421.

The voltage drivers 420 can provide voltages on word lines (WL), SGS control gates and SGD control gates, for example. Specifically, the voltage drivers 420 can include separate SGS and SGD drivers for each sub-block. For example, SGS drivers 445, 445a, 445b and 445c, and SGD drivers 446, 446a, 446b and 446c can be provided for SB0, SB1, SB2 and SB3, respectively, such as in FIGS. 7 and 8. The voltage drivers can also include a selected data WL driver 447, an unselected data WLs driver 447a, and a dummy WL driver 447b. In some case, different dummy word lines can be driven at different levels.

The various components, including the row decoder, may receive commands from a controller such as the state machine 112 or the controller 122 to perform the functions described herein.

A source line voltage driver 430 provides the voltage Vsl to the source lines/diffusion region in the substrate via control lines 432. For example, an erase voltage can be provided to the substrate in an erase operation. In one approach, the source diffusion region 433 is common to the blocks. A set of bit lines 442 is also shared by the blocks. A bit line voltage driver 440 provides voltages to the bit lines.

Figure 5:
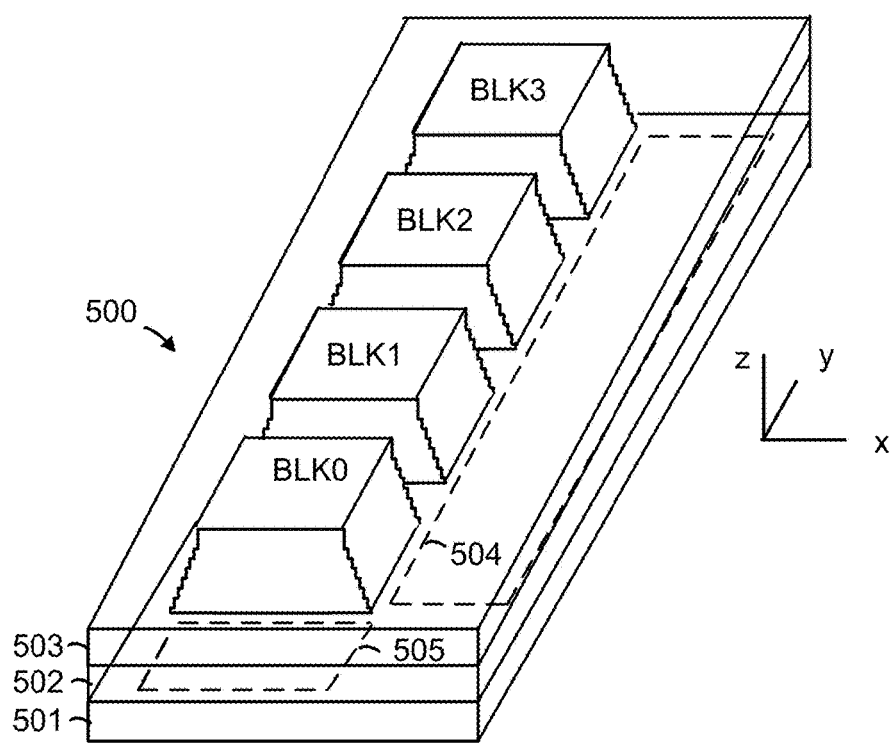
FIG. 5 is a perspective view of a memory device 500 comprising a set of blocks in an example 3D configuration of the memory structure 126 of FIG. 1.

FIG. 5 is a perspective view of a memory device 500 comprising a set of blocks in an example 3D configuration of the memory structure 126 of FIG. 1. On the substrate are example blocks BLK0, BLK1, BLK2 and BLK3 of memory cells (storage elements) and peripheral areas with circuitry for use by the blocks. The peripheral area 504 runs along an edge of each block while the peripheral area 505 is at an end of the set of blocks. The pass gates for a voltage driver of the SGS transistors may be located in this peripheral area 505, in one approach. In this case, the blocks BLK0, BLK1, BLK2 and BLK3 are at progressively further distances from the pass gates. The circuitry can include voltage drivers which can be connected to control gate layers, bit lines and source lines of the blocks. In one approach, control gate layers at a common height in the blocks are commonly driven. The substrate 501 can also carry circuitry under the blocks, and one or more lower metal layers which are patterned in conductive paths to carry signals of the circuitry. The blocks are formed in an intermediate region 502 of the memory device. In an upper region 503 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While four blocks are depicted as an example, two or more blocks can be used, extending in the x- and/or y-directions.

In one possible approach, the blocks are in a plane, and the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device. The blocks could also be arranged in multiple planes.

FIG. 6A depicts an example cross-sectional view of a portion of one of the blocks of FIG. 5. The block comprises a stack 610 of alternating conductive and dielectric layers. In this example, the conductive layers comprise two SGD layers, one SGS layer, two source side dummy word line layers (or word lines) WLDS1 and WLDS0, two drain side dummy word line layers WLDD1 and WLDD0, and eleven data word line layers (or data word lines) WLL0-WLL10. WLL0 is a source side data word line and WLDS1 is a dummy word line layer which is adjacent to the source side data word line. WLDS0 is another dummy word line layer which is adjacent to WLDS1. WLL10 is a drain side data word line and WLDD1 is a dummy word line layer which is adjacent to the drain side data word line. WLDD0 is another dummy word line layer which is adjacent to WLDD1. The dielectric layers are labelled as DL1-1L19. Further, regions of the stack which comprise NAND strings NS1 and NS2 are depicted. Each NAND string encompasses a memory hole 618 or 619 which is filled with materials which form memory cells adjacent to the word lines. Region 622 of the stack is shown in greater detail in FIG. 6C.

The stack includes a substrate 611. In one approach, a portion of the source line SL comprises an n-type source diffusion layer 611a in the substrate which is in contact with a source end of each string of memory cells in a block. An erase voltage may be applied to this layer in an erase operation The n-type source diffusion layer 611a is formed in a p-type well region 611b, which in turn is formed in an n-type well region 611c, which in turn is formed in a p-type semiconductor substrate 611d, in one possible implementation. The n-type source diffusion layer may be shared by all of the blocks in a plane, in one approach.

NS1 has a source-end 613 at a bottom 616b of the stack 616 and a drain-end 615 at a top 616a of the stack. Metal-filled slits 617 and 620 may be provided periodically across the stack as interconnects which extend through the stack, such as to connect the source line to a line above the stack. The slits may be used during the formation of the word lines and subsequently filled with metal. A portion of a bit line BL0 is also depicted. A conductive via 621 connects the drain-end 615 to BL0.

In one approach, the block of memory cells comprises a stack of alternating control gate and dielectric layers, and the memory cells are arranged in vertically extending memory holes in the stack.

In one approach, each block comprises a terraced edge in which vertical interconnects connect to each layer, including the SGS, WL and SGD layers, and extend upward to horizontal paths to voltage drivers.

FIG. 6B depicts an example transistor 650. The transistor comprises a control gate CG, a drain D, a source S and a channel CH and may represent a memory cell or a select gate transistor, for example.

FIG. 6C depicts a close-up view of the region 622 of the stack of FIG. 6A. Memory cells are formed at the different levels of the stack at the intersection of a word line layer and a memory hole. In this example, SGD transistors 680 and 681 are provided above dummy memory cells 682 and 683 and a data memory cell MC. A number of layers can be deposited along the sidewall (SW) of the memory hole 630 and/or within each word line layer, e.g., using atomic layer deposition. For example, each pillar 699 or column which is formed by the materials within a memory hole can include a charge-trapping layer 663 or film such as silicon nitride (Si3N4) or other nitride, a tunneling layer 664, a channel 665 (e.g., comprising polysilicon), and a dielectric core 666. A word line layer can include a blocking oxide/block high-k material 660, a metal barrier 661, and a conductive metal 662 such as Tungsten as a control gate. For example, control gates 690, 691, 692, 693 and 694 are provided. In this example, all of the layers except the metal are provided in the memory hole. In other approaches, some of the layers can be in the control gate layer. Additional pillars are similarly formed in the different memory holes. A pillar can form a columnar active area (AA) of a NAND string.

Each memory string comprises a channel which extends continuously from the source-end select gate transistor to the drain-end select gate transistor.

When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to the amount of stored charge. During an erase operation, the electrons return to the channel.

Each of the memory holes can be filled with a plurality of annular layers comprising a blocking oxide layer, a charge trapping layer, a tunneling layer and a channel layer. A core region of each of the memory holes is filled with a body material, and the plurality of annular layers are between the core region and the word line in each of the memory holes.

The NAND string can be considered to have a floating body channel because the length of the channel is not formed on a substrate. Further, the NAND string is provided by a plurality of word line layers above one another in a stack, and separated from one another by dielectric layers.

FIG. 7 depicts an example view of NAND strings in sub-blocks in a 3D configuration which is consistent with FIG. 6A. Each sub-block includes multiple NAND strings, where one example NAND string is depicted. For example, SB0, SB1, SB2 and SB3 comprise example NAND strings 700n, 710n, 720n and 730n, respectively. The NAND strings have data word lines, dummy word lines and select gate lines consistent with FIG. 6A. In a block BLK, each sub-block comprises a set of NAND strings which extend in the x direction and which have a common SGD line. The NAND strings 700n, 710n, 720n and 730n are in sub-blocks SB0, SB1, SB2 and SB3, respectively. Programming of the block may occur based on a word line programming order. One option is to program the memory cells in different portions of a word line which are in the different sub-blocks, one sub-block at a time, before programming the memory cells of the next word line. Another option programs all of the memory cells in one sub-bloc, one word line at a time, before programming the memory cells of the next sub-block. The word line programming order may start at WL0, the source-end word line and end at WLL10, the drain-end word line, for example.

The NAND strings 700n, 710n, 720n and 730n have channels 700a, 710a, 720a and 730a, respectively.

Additionally, NAND string 700n includes SGS transistor 701, dummy memory cells 702 and 703, data memory cells 704, 705, 706, 707, 708, 709, 710, 711, 712, 713 and 714, dummy memory cells 715 and 716, and SGD transistors 717 and 718.

NAND string 710n includes SGS transistor 721, dummy memory cells 722 and 723, data memory cells 724, 725, 726, 727, 728, 729, 730, 731, 732, 733 and 734, dummy memory cells 735 and 736, and SGD transistors 737 and 738.

NAND string 720n includes SGS transistor 741, dummy memory cells 742 and 743, data memory cells 744, 745, 746, 747, 748, 749, 750, 751, 752, 753 and 754, dummy memory cells 755 and 756, and SGD transistors 757 and 758.

NAND string 730n includes SGS transistor 761, dummy memory cells 762 and 763, data memory cells 764, 765, 766, 767, 768, 769, 770, 771, 772, 773 and 774, dummy memory cells 775 and 776, and SGD transistors 777 and 778.

One or more SGD transistors are provided at the drain-end of each memory string, and one or more SGS transistors are provided at the source-end of each memory string. The SGD transistors in SB0, SB1, SB2 and SB3 may be driven by separate control lines SGD0(0) and SGD1(0), SGD0(1) and SGD1(1), SGD0(2) and SGD1(2), and SGD0(3) and SGD1(3), respectively, in one approach. In another approach, all of the SGD transistors in a sub-block are connected and commonly driven. The SGS transistors in SB0, SB1, SB2 and SB3 may be driven by control lines SGS(0), SGS(1), SGS(2) and SGS(3), respectively.

Figure 8:
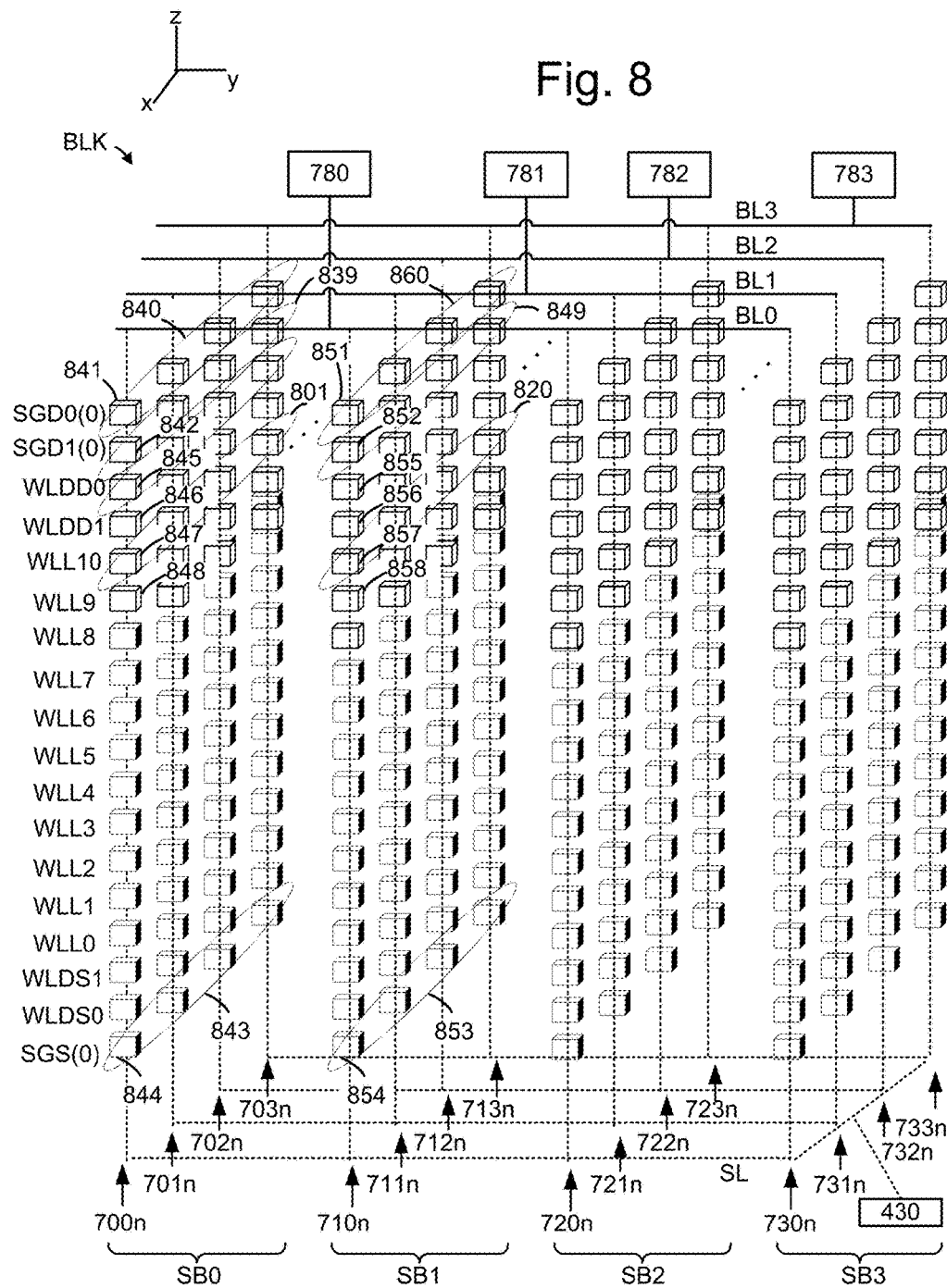
FIG. 8 depicts additional detail of the sub-blocks SB0-SB3 of FIG. 7.

FIG. 8 depicts additional detail of the sub-blocks SB0-SB3 of FIG. 7. Example memory cells are depicted which extend in the x direction along word lines in each sub-block. Each memory cell is depicted as a cube for simplicity. SB0 includes NAND strings 700n, 701n, 702n and 703n. SB1 includes NAND strings 710n, 711n, 712n and 713n. SB2 includes NAND strings 720n, 721n, 722n and 723n. SB3 includes NAND strings 730n, 731n, 732n and 733n. Bit lines are connected to sets of NAND strings. For example, a bit line BL0 is connected to NAND strings 700n, 710n, 720n and 730n, a bit line BL1 is connected to NAND strings 701n, 711n, 721n and 731n, a bit line BL2 is connected to NAND strings 702n, 712n, 722n and 732n, and a bit line BL3 is connected to NAND strings 703n, 713n, 723n and 733n. Sensing circuitry may be connected to each bit line. For example, sensing circuitry 780, 781, 782 and 783 is connected to bit lines BL0, BL1, BL2 and BL3. A bit line voltage driver may be provided with the sensing circuitry.

Programming and reading can occur for selected cells in one word line and one sub-block at a time. This allows each selected cell to be controlled by a respective bit line and/or source line. For example, a set of memory cells 801, which includes an example memory cell 847, is connected to WLL10 in SB0. This is the drain-end data word line. WLL0 is the source-end data word line. A set of memory cells may be programmed or read concurrently. An additional set of memory cells is connected to WLL10 in each of the other sub-blocks SB1-SB3. For example, a set of memory cells 820, which includes an example memory cell 857, is connected to WLL10 in SB1.

In this example, the source line SL or source region is driven at a voltage Vsl by the source line voltage driver 430.

Each memory string includes one or more SGD transistors at the drain-end and one or more SGS transistors at the source end. In this case, there are two SGD transistors and one SGS transistor per string. Each SGD transistor may be connected to separate control line layer, as in FIG. 7, so that it can be driven separately, or the two or more SGD transistors in a string may have their control gates connected and commonly driven. For example, SB0 has sets of SGD transistors 840 and 839, with example SGD transistors 841 and 842, respectively, in the memory string 700n. SB0 also has a set of SGS transistors 843, with an example SGS transistor 844 in the memory string 700n. Similarly, SB1 has sets of SGD transistors 860 and 849, with example SGD transistors 851 and 852, respectively, in the memory string 710n. SB1 also has a set of SGS transistors 853, with an example SGS transistor 854 in the memory string 710n.

The memory string 700n includes SGD transistors 841 and 842 connected to select gate control lines SGD0(0) and SGD1(0), respectively, dummy memory cells 845 and 846 connected to WLDD0 and WLDD1, respectively, and data memory cells 847 and 848 connected to WLL10 and WLL9, respectively. See also FIG. 9A to 9C. The memory string 710n includes SGD transistors 851 and 852 connected to select gate control lines SGD0(1) and SGD1(1) (see FIG. 7), respectively, dummy memory cells 855 and 856 connected to WLDD0 and WLDD1, respectively, and data memory cells 857 and 858 connected to WLL10 and WLL9, respectively.

Figure 9A:
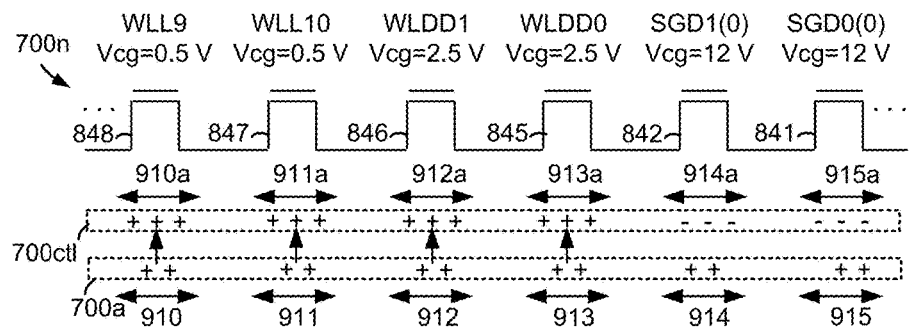
FIG. 9A depicts a plot of a portion of the memory string 700n of FIGS. 7 and 8 during an erase operation, showing how holes (+) are collected in a portion 913a of a charge-trapping layer 700ctl adjacent to a dummy memory cell 845 while electrons are stored in a portion 914a of the charge-trapping layer adjacent to a select gate transistor 842.

FIG. 9A depicts a plot of a portion of the memory string 700n of FIGS. 7 and 8 during an erase operation, showing how holes (+) are collected in a portion 913a of a charge-trapping layer 700ctl adjacent to a dummy memory cell 845 while electrons are stored in a portion 914a of the charge-trapping layer adjacent to a select gate transistor 842.

Figure 9B:
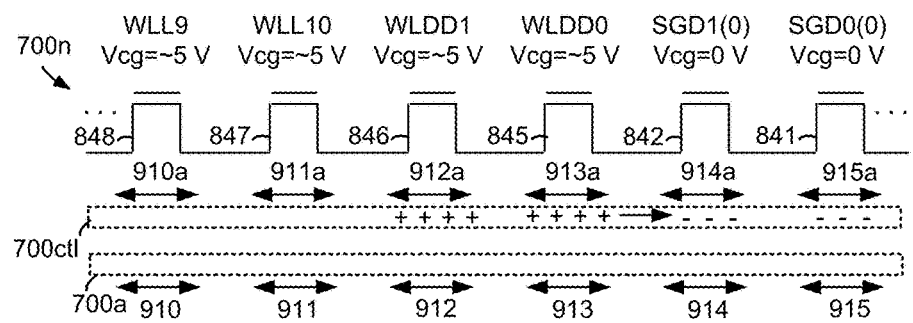
FIG. 9B depicts a plot of the portion of the memory string of FIG. 9A after read or programming, showing how holes (+) can migrate from the portion 913a to the portion 914a of the charge-trapping layer 700ctl, resulting in charge loss for the select gate transistor 842.
Figure 9C:
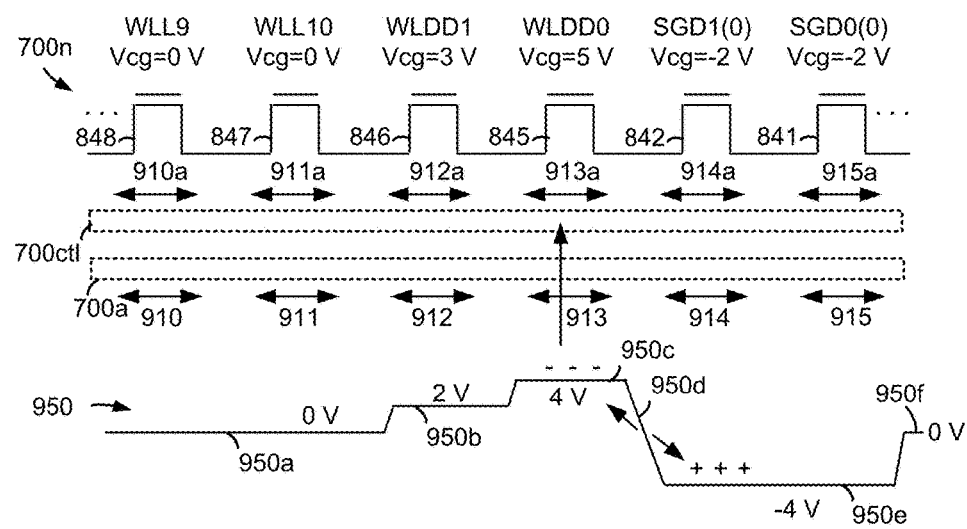
FIG. 9C depicts a plot of the portion of the memory string of FIG. 9A during a transition from a pre-charge phase to a program phase of a program loop, along with a plot of a voltage in the channel 700a, showing how a gradient (plot 950d) is intentionally maximized to enhance disturb of the dummy memory cell 845.

In FIG. 9A to 9C, a portion of the memory string 700n and its channel 700a and a charge trapping layer 700ctl are depicted. See also FIGS. 7 and 8. The portion of the memory string shown includes the SGD transistors 841 and 842 connected to SGD0(0) and SGD1(0), respectively, the dummy memory cells 845 and 846 connected to WLDD0 and WLDD1, respectively, and the data memory cells 847 and 848 connected to WLL10 and WLL9, respectively. The remaining data memory cells and the SGS transistor extend to the left in the figure.

In the selected memory string 700*n*, the SGD transistors 841 and 842 are adjacent to channel portions 915 and 914, respectively, and charge trapping layer portions 915*a* and 914*a*, respectively. The dummy memory cells 845 and 846 are adjacent to channel portions 913 and 912, respectively, and charge trapping layer portions 913*a* and 912*a*, respectively. The data memory cells 847 and 848 are adjacent to channel portions 911 and 910, respectively, and charge trapping layer portions 911*a* and 910*a*, respectively. Two drain-end dummy memory cells are provided as an example. In practice, one or more drain-end dummy memory cells can be provided in each memory string.

Each select gate transistor or memory cell has a threshold voltage (Vth) and a control gate or word line voltage. Typical values can include Vth=2 V for the SGD transistors and Vth=1 V for the dummy memory cells. The Vth of a data memory cell can vary based on whether the cell is programed, and if it is programmed, based on its data state. Generally, the programming of the cells is random so that a memory string will have cells in different states.

In the erase operation, assume that the voltages on SGD0 (0) and SGD1(0) are floating at a level of Vcg=12 V, the voltages on WLDD0 and WLDD1 are driven at Vcg=2 V and the voltages on WLL10 and WLL9 are driven at Vcg=0.5 V. See also FIG. 18A. The channel is charged up to a relatively high level such as 14 V so that the memory cells have a high channel-to-gate voltage and are erased. The dummy memory cells may have a higher Vcg (and thus a lower channel-to-gate voltage) than the data memory cells so the dummy memory cells are slightly less deeply erased than the data memory cells.

The charged state of the channel is represented by the holes (+). Due to the high control gate voltage of the SGD transistors, the holes in the channel portions 914 and 915 are not drawn into the charge trapping layer portions 914*a* and 915*a* to erase these transistors. Moreover, the SGD transistors may be programmed to a Vth such as 2 V at the time of manufacture. This programed state is represented by the electrons (−) in the charge trapping layer portions 914*a* and 915*a*. Holes in the channel portions 910-913 tunnel from the channel into the charge trapping layer portions 910*a*-913*a* and are stored there. The holes will combine with any electrons in the charge trapping layer to erase these cells. The movement of the holes is represented by the vertical arrows.

FIG. 9B depicts a plot of the portion of the memory string of FIG. 9A after read or programming, showing how holes (+) can migrate from the portion 913*a* to the portion 914*a* of the charge-trapping layer 700*ctl*, resulting in charge loss for the select gate transistor 842. The control gate (word line) voltages for the dummy and data memory cells can be coupled up after a program, read or erase operation is performed. See also FIG. 19A to 19D. An example level of about 5 V is depicted for the Vcg of the cells 845-848. With 5 V on the control gate on the dummy memory cell 845 and 0 V (a ground voltage) on the control gate of the adjacent SGD transistor 842, an electric field (where the voltage is higher on the dummy memory cell 845 than the SGD transistor 842) is created between these transistors which causes some of the holes which have been stored in the charge trapping layer portion 913*a* of the dummy memory cell after the erase operation to move toward the electrons in the which have been stored in the charge trapping layer portion 914*a* of the SGD transistor 842. This movement is represented by a horizontal arrow and is due to the Poole-Frankel effect. The holes will combine with the electrons, resulting in a charge loss for the SGD transistor 842. The charge loss is seen as a Vth downshift, as depicted in FIGS. 10A and 10B. Moreover, as mentioned, more holes will move as time passes and the electric field is present. This process is repeated when the cells are subsequently erased, programmed and read.

Note that the SGD transistor 841 which is not adjacent to the dummy memory cell 845 does not experience this charge loss.

FIG. 9C depicts a plot of the portion of the memory string of FIG. 9A during a transition from a pre-charge phase to a program phase of a program loop, along with a plot 950 of a voltage in the channel 700*a*, showing how a gradient (plot 950*d*) is intentionally maximized to enhance disturb of the dummy memory cell 845. The scenario corresponds to the transition phase of t1-t5 in FIG. 15A, and plot 1520*c*, where Vsgd_sel is at −2 V and plot 1550*c*, where Vsgd_sel is at 5 V.

In the transition phase, the SGD transistors become non-conductive so that the channel portions under the dummy and data memory cells are floating. In this case, the voltage of a channel portion is set by the control gate voltage minus the Vth of a transistor. For example, with Vcg=−2 V for the SGD transistors and Vth=2 V, the channel voltage is −4 V for channel portions 914 and 915 (plot 950*e*). With Vcg=5 V for the dummy memory cell 845, and Vth=1 V, the channel voltage is 4 V for the channel portion 913 (plot 950*c*). As a result, there is a channel gradient of 8 V as depicted by the plot 950*d*. This gradient causes electron-hole pairs to be generated, where the electrons (−) moved toward the dummy memory cell 845 (as represented by the vertical arrow) and can be injected into the charge trapping layer portion 913*a*. This results in a disturb, e.g., Vth increase or weak programming, of the dummy memory cell 845. The holes (+) move toward the channel portion 914, as discussed, and the disturb accumulates over multiple program or erase cycles.

With Vcg=3 V for the dummy memory cell 846, and Vth=1 V, the channel voltage is 2 V for the channel portion 912 (plot 950*b*). With Vcg=0 V for the data memory cells 847 and 848, and Vth=0 V, assuming they are in the erased state as an example, the channel voltage is 0 V for the channel portions 911 and 910 (plot 950*a*). At the drain end of the channel, the bit line may be at 0 V for example (plot 1540*e* in FIG. 15A). See plot 950*f*.

Accordingly, by enhancing or increasing the channel gradient between the dummy memory cell and the SGD transistor, the amount of programming of the dummy memory cell can be increased and this in turn can reduce the amount of Vth downshift. The amount of programming of the dummy memory cell does not become too high because the amount of disturb reaches a maximum over time. See FIG. 13B. Moreover, the dummy memory cells are periodically erased, removing the Vth upshift on them caused by the additional programming.

The amount of Vth downshift of the SGD transistor can be reduced by programming the dummy memory cells of WLDD0. This significantly reduces the number of holes in the charge trapping layer portion and the electric field between WLDD0 and SGD1(0).

Referring also to FIG. 15A, during a normal program operation, at the end of pre-charge, the SGD bias ramps down from about 6 V to Vss (0 V). The channel will be cut off when the SGD bias is close to the Vth of the SGD transistor, e.g., 2 V. Subsequently, the SGD bias continues to ramp down, causing the channel portion of the SGD transistor to become negative. On the other hand, the channel portion of the dummy memory cell is boosted up after the SGD transistor is cut off. This potential gradient will help generate electron-hole pairs inside the polysilicon channel. Some of the electrons will be injected into the dummy memory cell. However, without the enhancements provided herein, the amount of electron injection will be relatively small and insufficient to suppress the hole movement to the SGD transistor. To successfully reduce SGD cycling downshift, an enhanced programming of the dummy memory cells is provided. This programming can be called unintentional because it is a side effect of another operation, e.g., programming of data memory cells, or erasing of data and dummy memory cells rather than a dedicated programming operation for the dummy memory cells.

Also, referring to FIGS. 16 to 18B, at the end of a normal erase operation, the SGD bias ramps down to Vss (0 V), similar to the transition during programming mentioned above. When the channel portion of the SGD transistor becomes negative, the channel potential of the dummy memory cell is slightly positive. As before, this potential gradient will help generate electron-hole pairs, but without the enhancements provided herein, it is insufficient to suppress the hole movement to the SGD transistor. The enhancements can be used during program and/or erase operations.

FIG. 10A depicts a threshold voltage distribution of select gate transistors based on a repeated cycle of: erase, program, read and delay, showing how the distribution is downshifted less when the dummy memory cells are more programmed. In FIG. 10A to 10C, the vertical axis depicts a number of SGD transistors on a log scale and the horizontal axis depicts Vth. The peak of the distributions may be at about 1 V, for instance. Generally, the Vth distribution is shifted lower, at the lower tail, over time. Plot 1010f represents the Vth distribution of a fresh memory device, which has not been programmed. Plot 1010a represents a worst case downshift which is seen after a cycle of erase, program data memory cells, read and delay of 12 seconds, where the dummy memory cell is not programmed beyond its initial Vth.

Generally, a larger Vth downshift is seen for the SGD transistors when a larger delay exists after programming and before the subsequent erase. This is because the programming causes a coupling up of the word line, as explained in connection with FIG. 19A to 19D. If the downshift in the Vth of the SGD transistor becomes too large, it will be impossible to cutoff the channel, and severe program disturb of the data memory cells will occur. For example, this disturb could occur in the unselected sub-blocks during programming of a selected sub-block, where the SGD transistors are used to cutoff the channel to allow them to be boosted by the pass voltage.

The remaining plots represent Vth distributions for various levels of programming of the dummy memory cells. A cycle of erase, program dummy memory cells using one program pulse and no verify test, program data memory cells, read and delay of 12 seconds was followed. The program pulse is increasingly larger for the remaining plots 1010b to 1010e, confirming the trend of a lower SGD Vth downshift when the adjacent dummy memory cell is more programmed and thus has a higher Vth. The programming of the data memory cells involved a full block and the data (except for the fresh case) was taken after 1500 cycles.

FIG. 10B depicts a threshold voltage distribution of select gate transistors based on a repeated cycle of: erase and delay, for different numbers of cycles. The delay is 3 seconds. Plot 1020f represents the Vth of a fresh memory device. The plots 1020e, 1020d, 1020c, 1020b and 1020a represent the Vth with an increasing number of cycles. This example omits programming of the data or dummy memory cells. The plots show that the Vth downshift increases as the number of cycles increases.

FIG. 10C depicts a threshold voltage distribution of select gate transistors based on a repeated cycle of: erase, programming of dummy memory cells and delay, for different numbers of cycles. The delay is 3 seconds. The plots overlap and represent the Vth with different numbers of cycles. This example omits programming of the data memory cells but includes programming of the dummy memory cells using a single program pulse of the same magnitude for each plot. The plots show that a Vth downshift is avoided by programming the dummy memory cells which are adjacent to the SGD transistors.

Figure 11:
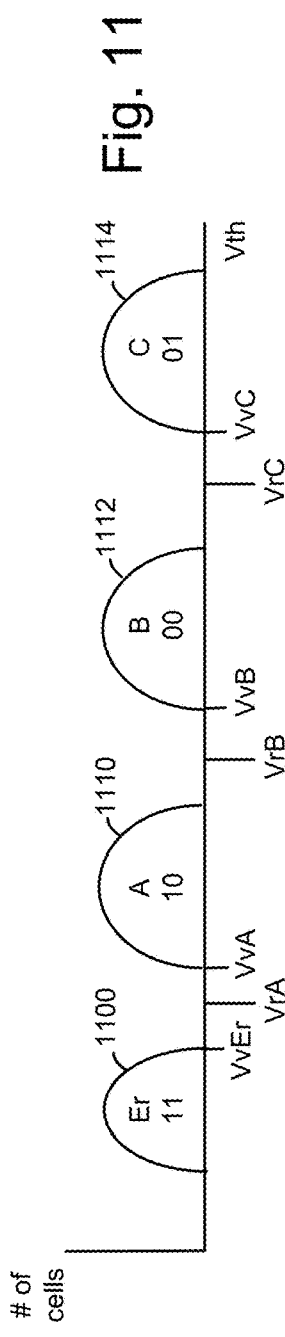
FIG. 11 depicts an example threshold voltage (Vth) distribution of a set of memory cells connected to a selected word line after a programming operation, where four data states are used.

FIG. 11 depicts an example threshold voltage (Vth) distribution of a set of memory cells connected to a selected word line after a programming operation, where four data states are used. A Vth distribution 1100 is provided for erased (Er) state memory cells. Three Vth distributions 1110, 1112 and 1114 represent assigned data states A, B and C, respectively, which are reached by memory cells when their Vth exceeds the verify voltage VvA, VvB or VvC, respectively. This example uses four data states. Other numbers of data states can be used as well, such as eight or sixteen. Read voltages VrA, VrB and VrC are used to read data from a set of cells having this Vth distribution. These verify voltages and read voltages are examples of control gate read levels of the selected word line voltage. VvEr is an erase-verify voltage for use in an erase operation.

During a programming operation, the final Vth distribution can be achieved by using one or more programming passes. Each pass may use incremental step pulse programming, for instance. During a programming pass, program loops are performed for a selected word line. A program loop comprises a program portion in which a program voltage is applied to the word line followed by a verify portion in which one or more verify tests are performed. Each programmed state has a verify voltage which is used in the verify test for the state.

A single-pass programming operation involves one sequence of multiple program-verify operations (or program loops) which are performed starting from an initial Vpgm level and proceeding to a final Vpgm level until the threshold voltages of a set of selected memory cells reach the verify voltages of the assigned data states. All memory cells may initially be in the erased state at the beginning of the programming pass. After the programming pass is completed, the data can be read from the memory cells using read voltages which are between the Vth distributions. At the same time, a read pass voltage, Vread pass (e.g., 9 V), also referred to as Vread, is applied to the remaining word lines. By testing whether the Vth of a given memory cell is above or below one or more of the read reference voltages, the system can determine the data state which is represented by a memory cell. These voltages are demarcation voltages because they demarcate between Vth ranges of different data states.

Moreover, the data which is programmed or read can be arranged in pages. For example, with four data states, or two bits per cell, two pages of data can be stored. An example encoding of bits for the Er, A, B and C states is 11, 10, 00 and 01, respectively, in the format of upper page (UP) bit/lower page (LP) bit. A lower page read may use VrA and VrC and an upper page read may use VrB.

Figure 12:
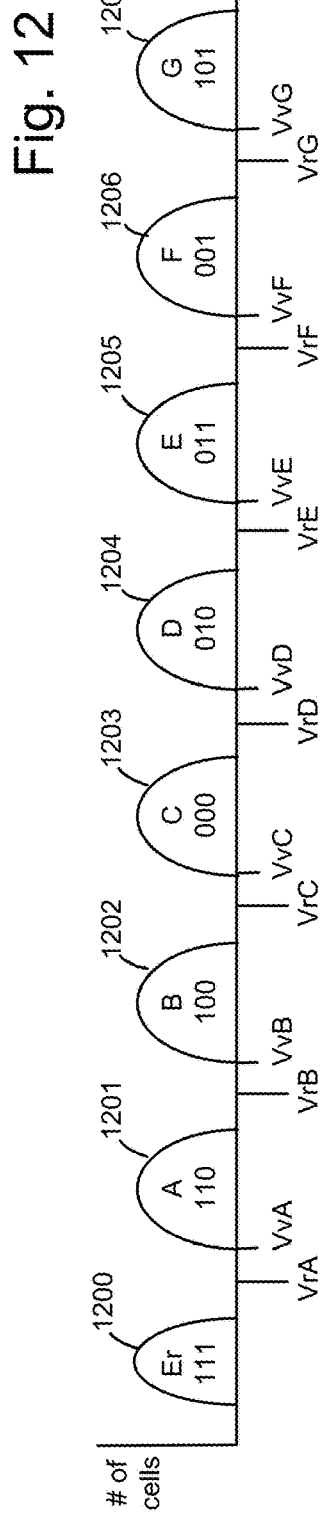
FIG. 12 depicts an example Vth distribution of a set of memory cells connected to a selected word line after a programming operation, where eight data states are used.

FIG. 12 depicts an example Vth distribution of a set of memory cells connected to a selected word line after a programming operation, where eight data states are used. Single-pass or multi-pass programming may be used to obtain this Vth distribution. Based on the write data as indicated, the cells which are to remain in the Er state are represented by the Vth distribution 1200. The cells which are to be programmed to the A, B, C, D, E, F and G states using verify voltages of VvA, VvB, VvC, VvD, VvE, VvF and VvG, respectively, are represented by the Vth distributions 1201, 1202, 1203, 1204, 1205, 1206 and 1207, respectively. Each data state represents three bits of data as indicated. Read voltages VrA, VrB, VrC, VrD, VrE, VrF and VrG can be used for reading the states of the cells in a read operation. These verify voltages and read voltages are examples of control gate read levels of the selected word line voltage. Other example programming operations may use additional data states and/or programming passes. For example, sixteen data state are possible.

With eight data states, or three bits per cell, three pages of data can be stored. An example encoding of bits for the A, B, C, D, E, F and G states is 111, 110, 100, 000, 010, 011, 001 and 101, respectively. The data of the lower page can be determined by reading the memory cells using read voltages of VrA and VrE. The data of the middle page can be determined by reading the memory cells using read voltages of VrB, VrD and VrF. The data of the upper page can be determined by reading the memory cells using read voltages of VrC and VrG.

Figure 13A:
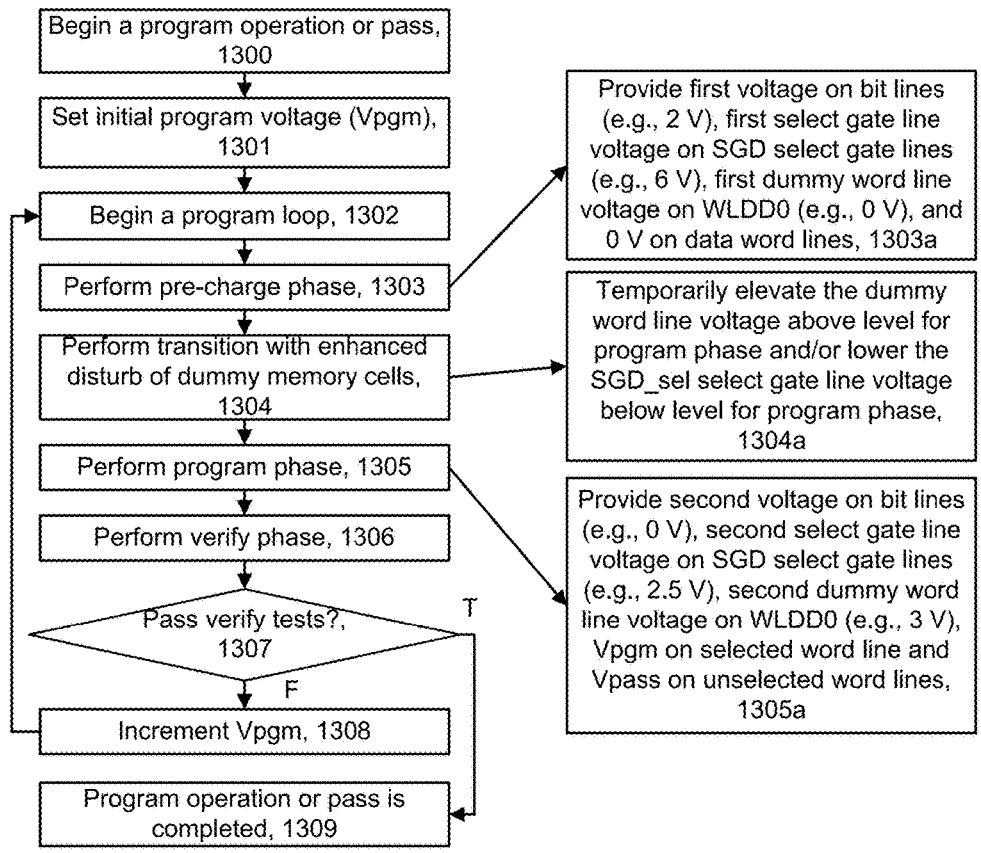
FIG. 13A depicts a process for programming data memory cells in which dummy memory cells are also programmed due to a disturb during a transition between a pre-charge phase and a program phase of a program loop.

FIG. 13A depicts a process for programming data memory cells in which dummy memory cells are also programmed due to a disturb during a transition between a pre-charge phase and a program phase of a program loop. See also FIG. 15A. Step 1300 begins a program operation or pass. In one approach, a programming operation comprises one or more program passes. Step 1301 sets an initial program voltage (Vpgm). See, e.g., FIG. 14 and Vpgm_init. Step 1302 begins a program loop. Step 1303 performs a pre-charge phase. This can include providing a first voltage on bit lines (e.g., 2 V, plot 1540a in FIG. 15A), a first select gate line voltage on SGD select gate lines (e.g., 6 V, plot 1510a and 1520a), a first dummy word line voltage on WLDD0 (e.g., 0 V, plot 1550a), and 0 V on data word lines (plot 1500d) (step 1303a).

Step 1304 performs a transition with enhanced disturb of the dummy memory cells. In one approach, the enhanced disturb is for a dummy memory cell adjacent to an SGD transistor. This can include temporarily elevating the dummy word line voltage above a level for the program phase (e.g., elevate to 5 V, plot 1550c or 1560c, above the 3 V level of plot 1550e or 1560b for the program phase) and/or lowering the SGD_sel select gate line voltage below a level for the program phase (e.g., lower to −2 V of plot 1520c, 0 V of plot 1510d, or 1 V of plot 1520b, below the 3 V level of plot 1510b or 1510e for the program phase). See step 1304a.

In one approach, the transition with enhanced disturb is performed in each program loop of a programming operation, for each word line which is programmed in a block. However, other options are possible. For example, the transition with enhanced disturb can be performed for fewer than all program loops of a programming operation. The transition with enhanced disturb can be performed during programming of fewer than all data word lines of a block. For example, it is useful to perform the transition with enhanced disturb while programming a first data word line in a block, or a first few data word lines in the block. This is generally sufficient to program the dummy memory cell to a level which prevents SGD charge loss. The remaining program and read operations can then proceed normally, without the enhanced disturb. Omitting the transition with enhanced disturb can save power in some cases.

In one approach, a program loop occurs during a program operation involving a selected word line, where the program loop provides a second difference between the voltage on the dummy word line and the voltage on the select gate line in a transition from the pre-charge phase to the program phase. The second difference is greater than a first difference by which the second dummy word line voltage exceeds the second select gate line voltage in the program phase. In a subsequent program operation involving another word line, a transition from the pre-charge phase to the program phase does not provide a difference between the voltage on the dummy word line and the voltage on the select gate line which is greater than a difference by which the second dummy word line voltage exceeds the second select gate line voltage in the program phase.

Step 1305 includes performing a program phase. This can include providing a second voltage on the bit lines (e.g., 0 V, plot 1540c for selected memory strings or 2 V, plot 1540f for unselected memory strings), a second select gate line voltage on the SGD select gate lines (e.g., 3 V, plot 1510b or 1510e), a second dummy word line voltage on WLDD0 (e.g., 3 V, plot 1550e or 1560b), Vpgm on the selected word line (e.g., 15-25 V, plot 1500b) and Vpass on unselected word lines (e.g., 8-10 V, plot 1500c). See step 1305a.

The program voltage is applied to a selected word line and a pass voltage is applied to the unselected word lines (e.g., the unselected data and dummy word lines). The selected word line could be one of WL0-WL10 in FIG. 7 or 8, for instance. This step also includes setting a program or inhibit status for the memory cells connected to the selected word line. A cell with an inhibit status has the associated bit line of the memory string set to a high level, e.g., 2-3 V which inhibits programming. A cell with a program status has the associated bit line of the memory string set to a low level, e.g., 0 V, which allows programming.

Step 1306 includes performing a verify phase, e.g., one or more verify tests, for the selected memory cells. This can involve applying a voltage at one or more control gate read levels (e.g., plot 1501) to the selected memory cells via the selected word line while applying a voltage at a read pass level (e.g., plot 1500c) to unselected word lines while sensing the memory cells. The sensing of a memory cell can involve detecting a level of a current in the associated memory string. The verify test determines whether each selected memory cell is in a conductive or non-conductive state. A decision step 1307 determines whether the verify tests are passed. If decision step 1307 is true, the program operation or pass is completed at step 1309. If the decision step 1307 is false, step 1308 increments Vpgm, and another program loop begins at step 1302. In a given program loop, a verify test may be performed for one or more assigned data states. For each assigned data state, the corresponding verify test is passed if all, or nearly all, of the memory cells which have the assigned data state pass the verify test. For example, the verify test may be passed if all, or nearly all, of the memory cells which have the assigned data state have a Vth greater than the control gate read level. This may be indicated by a current in the memory string exceeding a specified level as measured by a decay in the bit line voltage.

Figure 13B:
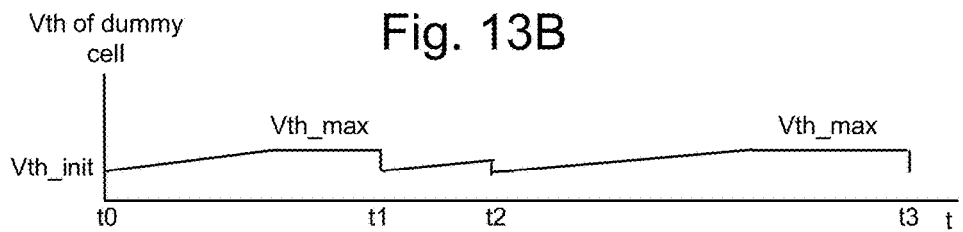
FIG. 13B depicts a plot of the Vth of a dummy memory cell versus time, showing how the dummy memory cell is gradually programmed using the process of FIG. 13A and occasionally erased.

FIG. 13B depicts a plot of the Vth of a dummy memory cell versus time, showing how the dummy memory cell is gradually programmed using the process of FIG. 13A and occasionally erased. The erase times are t0, t1, t2 and t3. The initial Vth of the dummy memory cell is Vth_init. This may be set at the time of manufacture. The Vth increases over time as the enhanced disturb condition is created in successive program and/or erase operations. The increase is not necessarily linear, but increases at a faster rate when the enhanced disturb condition is more frequently created. Moreover, the Vth may saturate at a maximum level, Vth_max, since the ability of the disturb condition to program the dummy memory cell reaches a limit. The Vth returns to Vth_init when the block is erased.

FIG. 14 depicts a series of program loops in an example programming operation, consistent with FIG. 13A. The pulse train 1400 includes a series of program pulses 1401-1415 that are applied to a word line selected for programming. The pulse train 1400 is an example of a second set of step-wise increasing program voltages. A pulse train typically includes program pulses which increase stepwise in amplitude in one or more program loops or program loops of a programming pass using a fixed or varying step size. In some cases, the program pulses increase in each program loop after the first. A new pulse train can be applied in each programming pass, starting at an initial level and ending at a final level which does not exceed a maximum allowed level. The initial levels can be the same or different in different programming passes. The final levels can also be the same or different in different programming passes. The step size can be the same or different in the different programming passes. In some cases, a smaller step size is used in a final programming pass to reduce Vth distribution widths.

Vpgm_init is the initial program voltage. One, two or three verify pulses are provided after each program pulse as an example, based on the assigned data states which are being verified. For example, an A-state verify pulse 1420 (VvA) is applied in program loops 1-3, A-state and B-state verify pulses 1421 (VvA and VvB, respectively) are applied in program loops 4-6, A-state, B-state and C-state verify pulses 1422 (VvA, VvB and VvC, respectively) are applied in program loops 7 and 8, B-state and C-state verify pulses 1423 are applied in program loops 9-11, and a C-state verify pulse 1424 is applied in program loops 12-15.

FIG. 15A depicts plots of various voltages used in a programming operation consistent with FIG. 13A. The vertical dimension denotes voltage and the horizontal dimension denotes time. The period of time depicted corresponds to one program loop, and includes a pre-charge phase 1590 from t0-t1, a transition 1591 from t1-t8, a program phase 1592 from t8-t10 and a verify phase 1593 from t10-t13. In the pre-charge phase, a positive voltage (Vbl) is provided to the channels of the memory strings to remove residue electrons and to provide a small amount of boosting such as 1-2 V. The SGD transistors are in a conductive state at this time.

A plot 1500 depicts voltages on a selected word line and unselected word lines. Plot 1500d is used during the pre-charge phase and the transition. Plots 1500a and 1500b are used for the selected word line during the program phase. Plots 1500a and 1500c are used for the unselected word lines during the program phase. Plots 1501 and 1500c are used on the selected and unselected word lines, respectively, during the verify phase. In this example, the verify test uses VvA from t11-t12 and VvB from t12-t13.

A plot 1510 depicts one example of voltages (Vsgd_sel) on the SGD transistors of a selected sub-block. The programming of the dummy memory cells can occur in the selected sub-block rather than in the unselected sub-blocks, in one approach. In the pre-charge phase, Vsgd_sel is set to a fairly high level such as 6 V (plot 1510a) which provides the SGD_sel transistors in a strongly conductive state. This allows the bit line voltage to be passed to the channel. Vsgd_sel is then decreased to a reduced level such as 3 V (plot 1510c and 1510b) which is still high enough to provide the SGD_sel transistors in a conductive state for the selected memory strings in the selected sub-block. However, it is low enough that the SGD_sel transistors can be provided in a non-conductive state for the locked out memory strings in the selected sub-block, by raising Vbl for those memory strings. Thus, the drain-end select gate transistor is in a conductive state during the pre-charge phase and the program phase, for the selected memory strings.

Vsgd_sel can be decreased directly from 6 V to 3 V (plot 1510c) or decreased to 0 V (plot 1510d) and then increased to 3 V (plot 1510b), for instance.

When Vsgd_sel decreases below the Vth of the SGD transistor 842 (FIG. 9C), e.g., 2 V, the channel portion 914 adjacent to the transistor is cutoff or non-conductive. See time t1. In this state, the channel voltage is tied to the control gate voltage.

A plot 1520 depicts another example of Vsgd_sel. In the pre-charge phase, Vsgd_sel is set to 6 V again (plot 1520a). Vsgd_sel is then decreased to a level such as 1 V (plot 1520b) or −2 V (plot 1520c). Both of these levels are lower than the level (3 V) used during the program phase. Generally, a lower value results in a lower channel voltage adjacent to the SGD transistor and a larger gradient (plot 950d) (and more programming of the dummy memory cell 845). If Vsgd_sel is decreased to 1 V or −2 V, it may increase to 3 V at t4. Or, Vsgd_sel may increase from −2 V to 0 V at t4 and then (plot 1520e) to 3 V at t7.

A plot 1530 depicts an example of Vsgd_unsel. This is for the unselected sub-blocks. In the pre-charge phase, Vsgd_sel is set to 6 V again. Vsgd_sel is then decreased to a level such as 0 V for a remainder of the program loop, in one approach.

A plot 1540 depicts an example of Vbl, bit line voltage. In the pre-charge phase, Vbl is set to 2 V, for instance (plot 1540a). Vbl is then decreased to a level such as 0 V at t1 (plot 1540e) or t4 (plot 1540b). Plot 1540b represents a delay in the decrease of Vbl relative to the decrease of Vsgd_sel at t1. Delaying the decrease can cause the SGD transistor to cutoff sooner when it is decreased at t1 so that the channel portion adjacent to Vsgd_sel is potentially further reduced, or reduced for a longer period of time. The SGD transistor is cutoff when Vcg−Vd>Vth, where the drain voltage Vd is Vbl. See also FIG. 6B. Thus, a higher Vbl results in the SGD transistor cutting off sooner as Vsgd_sel is decreased, at a higher Vcg In the program phase, Vbl can be at 0 V (plot 1540c) for the selected memory strings which are not locked out from programming in the current program loop, or 2 V (plot 1540f) for the unselected memory strings which are locked out from programming in the current program loop. Vbl can also be elevated during the verify phase (plot 1540d).

A plot 1550 depicts one example of the dummy word line voltage, Vdd0. Vdd0 is kept at 0 V in the pre-charge phase (plot 1550a), in one approach. This allows for a larger swing in the voltage when it is increased to Vpass. The capacitive coupling up of the channel in the unselected sub-blocks depends on this swing. In one option, Vdd0 is increased in the transition at t1 to the level which is maintained during the program phase (e.g., 3 V, plot 1550*e*). In another option, Vdd0 is increased in the transition at t1 to a level which is higher than the level which is maintained during the program phase (e.g., 5 V, plot 1550*c*). With the SGD transistor cutoff, a higher Vdd0 results in a higher voltage in the channel portion 913 and a larger gradient (plot 950*d*).

A plot 1560 depicts another example of Vdd0. Vdd0 is kept at 0 V in the pre-charge phase (plot 1560*a*), in one approach. In one option, Vdd0 is increased in the transition at t3 to the level which is maintained during the program phase (e.g., 3 V, plot 1560*b*). In another option, Vdd0 is increased in the transition at t3 to a level which is higher than the level which is maintained during the program phase (e.g., 5 V, plot 1560*c*). As before, a higher Vdd0 results in a higher voltage in the channel portion 913 and a larger gradient (plot 950*d*). Delaying the increase in Vbl ensures that the SGD_sel transistor is cutoff and that Vsgd_sel has reached its minimum level. This ensures that a difference between Vdd0 and Vsgd_sel is a maximum, so that the gradient (plot 950*d*) is a maximum. The delay can also provide the difference at the maximum for a longer period of time to further enhance the disturb.

FIG. 15B depicts a table of voltages consistent with FIG. 15A. The transition period is depicted. In this example, the SGD transistors have Vth=2 V and the dummy memory cell on WLDD0 has Vth=1 V. Vdd0 can be at 3 V (plots 1550*e*, 1560*b*) or 5 V (plots 1550*c*, 1560*c*), and Vsgd can be at −2 V (plot 1520*c*), 0 V (plot 1510*d*), 1 V (plot 1520*b*) or 3 V (plot 1510*c*). In the program phase, Vdd0−Vsgd is a first difference between the voltage on the dummy word line and the voltage on the select gate line. In the transition, Vdd0−Vsgd is a second difference between the voltage on the dummy word line and the voltage on the select gate line. The second difference is greater than the first difference, in one approach. This ensures that an enhanced channel gradient is provided during the transition which promotes programming of the dummy memory cell.

Vch_dd0 is a voltage in the channel portion 913 and Vch_sgd is a voltage in the channel portion 914. Vch_dd0−Vch_sgd is the difference between these two voltages and represents the magnitude of the channel gradient (plot 950*d*). It is desirable to make this amount relatively large to enhance the programming of the dummy memory cells. For cases 1-4, Vdd0=3 V and Vch_dd0=2 V and for case 5-8, Vdd0=5 V and Vch_dd0=4 V. For cases 1-4, as Vsgd increases, Vch_sgd also increases and Vch_dd0−Vch_sgd decreases. A smaller Vsgd (e.g., a smaller magnitude positive number or a larger magnitude negative number) is therefore desired to provide a larger Vch_dd0−Vch_sgd. A similar result is seen for cases 5-8, although Vch_dd0−Vch_sgd is higher by 2 V for each case than for cases 1-4. The amount of the enhancement of the programming of the dummy memory cells can be adjusted by adjusting one of more of: the minimum value of Vsgd during the transition, the amount of time Vsgd is at the minimum level, the maximum level of Vdd0 during the transition and the amount of time Vdd0 is at the maximum level. In the table, the enhancement is largest for case 5: Vsgd=−2 V and Vdd0=5 V.

FIG. 16 depicts a process for erasing memory cells in which dummy memory cells are programmed due to a disturb during a transition at an end of the erase operation. See also FIGS. 17A, 17B and 18A. As mentioned, the enhanced programming of the dummy memory cell can occur during program and/or erase operations. Step 1600 includes charging up (e.g., increasing a voltage of) a channel of a memory string by ramping up an erase voltage on the substrate from 0 V to V1 (e.g., 7 V) and holding the voltage at that level. Typically all of the memory strings in a block are erased together. This step also includes providing the SGD and SGS transistors and dummy and data word lines at fixed levels. Step 1601 includes further charging up the channel by ramping up the erase voltage from V1 to V2 (e.g., 14 V or higher). This step also includes floating the drain-end select gate transistor at a first drain-end select gate transistor voltage while a voltage of the dummy memory cell is driven at a first dummy memory cell voltage. In another option, the erase voltage is ramped up continuously from 0 V to the peak level of V2.

Step 1602 includes, after the charging, ramping down the erase voltage, and providing an enhanced gradient in the channel between the dummy memory cell and the drain-end select gate transistor by increasing the voltage of the dummy memory cell from the first dummy memory cell voltage to a second dummy memory cell voltage, and/or decreasing the voltage of the drain-end select gate transistor from the first drain-end select gate transistor voltage to a negative voltage.

Step 1603 includes performing an erase verify test. If the block of memory cells passes the erase verify test at decision step 1604, the erase is completed at step 1606. If decision step 1604 is false, step 1605 increments the peak erase voltage (V2) and a next erase loop begins at step 1600. An erase verify test for a block can involve applying an erase verify voltage VvEr (FIG. 11) to the word lines while sensing a current in the memory strings. If the current is sufficiently high, the memory string is considered to pass the verify test. The block in turn passes the verify test if all, or nearly all, of the memory strings pass the verify test.

FIG. 17A depicts a plot of example erase voltages applied to a substrate in an erase operation consistent with FIG. 16. The vertical axis depicts Verase and the horizontal axis depicts the erase loop number. Verase has an initial peak magnitude (V2) of Vinit and steps up in magnitude in each successive erase loop. A total of three loops are used to complete the erase operation in this example. Erase voltages 1701, 1702 and 1703 are applied in the erase loops 1, 2 and 3, respectively. Verase is the voltage applied to the substrate via the local interconnect.

FIG. 17B depicts a plot of verify voltages applied to word lines in a block, consistent with the example of FIG. 17A. The vertical axis depicts Vwl (word line voltage) and the horizontal axis depicts the erase loop number. An example erase verify voltage 1711 is depicted. This voltage (VvEr) may have a magnitude near 0 V, for example. An erase verify voltage is typically applied after each erase voltage as part of an erase verify test of a block.

FIG. 18A depicts plots of various voltages used in an erase operation consistent with FIG. 16. The vertical dimension denotes voltage and the horizontal dimension denotes time. A portion of one erase loop is depicted. The voltages used for the erase-verify test are depicted in FIG. 17B and follow the time period in FIG. 18A. A plot 1800 depicts the erase voltage applied to the substrate, Verase. The erase voltage is increased to a first level V1 from t1-t2 and then held at that level from t2-t3. The ramp up of the substrate voltage is relatively slow due to the large capacities of the substrate. The erase voltage is then ramped up from V1 to V2 from t3-t4. A plot 1810 shows Vsgd. It is initially driven at 0 V from t1-t3 while the erase voltage ramps up. This prevents the SGD voltage from becoming too high, which might occur if the SGD voltage was allowed to float during the entire duration of the erase voltage. Floating a voltage of a control gate can involve disconnecting the control gate from a voltage driver.

Vsgd is allowed to float at t3, and floats higher as Verase increases. Verase charges up the channel, but there is a delay in the channel voltage near the SGD transistors relative to Verase because of the time needed to charge up the entire channel. As the channel voltage increases, Vsgd is coupled higher. For example, Verase might be 14 V while Vsgd is 12 V, considering that Vth=2 V for the SGD transistors.

Vdd0 is provided at a level such as 2 V (plot 1820) to provide a shallower erase of the dummy memory cells relative to the data memory cells, which have Vwl=0.5 V, for instance (plot 1840). Vbl (plot 1830) can be at a small positive level such as 2 V during the erase pulse.

At t6, the erase voltage is ramped down from V2 to 0 V. Vsgd can be ramped down to 0 V (plot 1810b) or to a negative voltage such as −2 V (plot 1810a) and then back up to 0 V at t8. Vdd0 can be increased to 4 V, for instance at t6 (plot 1820a) when Vsgd begins to ramp down, or at t7 (plot 1820b), when Vsgd has completed its ramp down and reached its minimum level of 0 V or −2 V, for example. Thus, Vdd0 can be increased to a level which is higher than a level used during the erase pulse and Vsgd can be decreased to a level which is lower than a level used during the erase pulse, and lower than a steady state, e.g., 0 V level, used after the erase pulse. Another option is for Vdd0 to stay at 2 V (plot 1820c).

Vbl can be decreased to 0 V, for instance at t6 (plot 1830a) when Vsgd begins to ramp down or at t8 (plot 1830b), when Vsgd has ramped down and completed its time period at the minimum level (plot 1810a). Vbl could also ramp down at another time such as t7, for instance. As in the transition period of the program loop, the delay in the ramp down of Vbl can cause the SGD transistor to cutoff sooner when it is decreased at t6 so that the channel portion adjacent to Vsgd_sel is further reduced, and/or reduced for a longer period of time.

FIG. 18B depicts a table of voltages consistent with FIG. 18A. The values are for the period t7-t8 in FIG. 18A. As in FIG. 15B, the SGD transistors have Vth=2 V and the dummy memory cell on WLDD0 has Vth=1 V. Vdd0 can be at 2 V (plot 1820c) or 4 V (plots 1820a, 1820b), and Vsgd can be at −2 V (plot 1810a), 0 V (plot 1810b). By decreasing Vsgd to a negative level and/or increasing Vdd0 above the level used during the erase pulse, this ensures that an enhanced channel gradient is provided which promotes programming of the dummy memory cell.

For cases 1 and 2, Vdd0=4 V and Vch_dd0=3 V and for case 3 and 4, Vdd0=2 V and Vch_dd0=1 V.

For cases 1 and 2, as Vsgd increases, Vch_sgd also increases and Vch_dd0−Vch_sgd decreases. A smaller Vsgd is therefore desired to provide a larger Vch_dd0−Vch_sgd. A similar result is seen for cases 3 and 4.

As with the programming in FIG. 15B, the amount of the enhancement of the programming of the dummy memory cells can be adjusted by adjusting one or more of: the minimum value of Vsgd during the transition, the amount of time Vsgd is at the minimum level, the maximum level of Vdd0 during the transition and the amount of time Vdd0 is at the maximum level. The transition here refers to a time period at the end of the erase pulse, such as t7-t8. In the table, the enhancement is largest for case 1: Vsgd=−2 V and Vdd0=4 V.

Figures 19A, 19B:
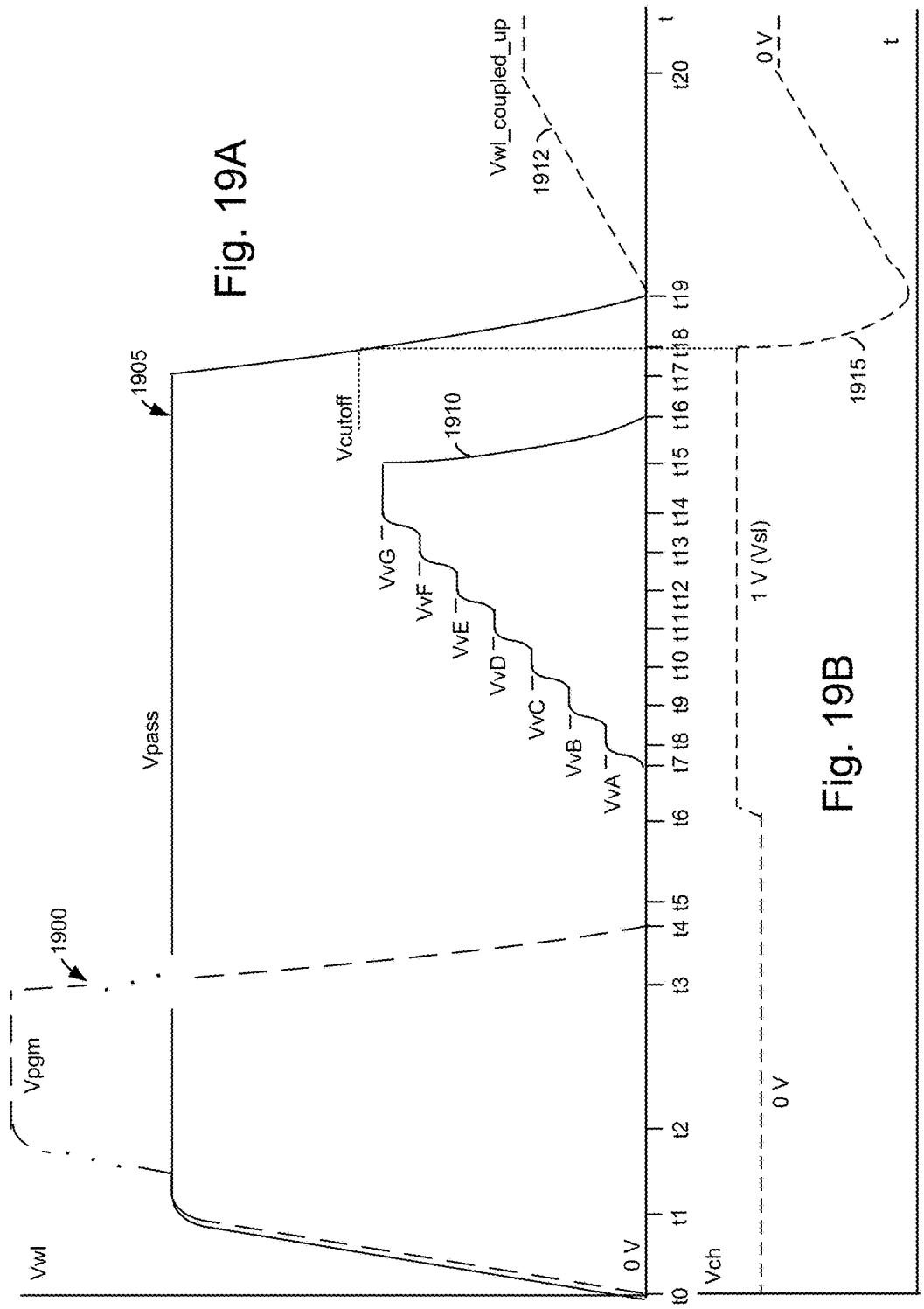
FIG. 19A depicts a plot of example waveforms in a programming operation, showing coupling up of a word line voltage.
FIG. 19B depicts a plot of a channel voltage (Vch) corresponding to FIG. 19A.

FIG. 19A depicts a plot of example waveforms in a programming operation, showing coupling up of a word line voltage. As mentioned, e.g., in connection with FIG. 9B, the control gate or word line voltage of the memory cells can be floated to a level such as 5 V after a program, read or erase operation. This results in an electric field which causes holes to move toward the SGD transistors and cause charge loss. FIGS. 19A and 19B describe the floating which occurs after a program operation and FIGS. 19C and 19D describe the floating which occurs after a read operation.

The time period shown represents one program-verify iteration or loop. The horizontal axis depicts time and the vertical axis depicts word line voltage, Vwl. A program voltage 1900 is applied to a selected word line from t0-t4 and reaches a magnitude of Vpgm. The program voltage can temporarily pause at an intermediate level such as Vpass to avoid a single large transition which can have undesired coupling effects. A pass voltage 1905 is applied to the unselected word lines from t0-t19 and reaches a magnitude of Vpass, which is sufficiently high to provide the cells in a conductive state so that the sensing (e.g., verify) operations can occur for the cells of the selected word line. The pass voltage includes an increasing portion, a fixed amplitude portion, for instance, at Vpass and a decreasing portion. Optionally, the pass voltage may be increased sooner relative to the program voltage so that Vpass is reached by t0.

A verify voltage 1910 is applied to the selected word line. In this example, all seven verify voltages are applied, one after another. An eight-level memory device is used in this example. Verify voltages of VvA, VvB, VvC, VvD, VvE, VvF and VvG are applied at t8, t9, t10, t11, t12, t13 and t14, respectively. The sense circuits may be activated during each verify voltage. The waveform decreases from VvG, or from a voltage slightly higher than VvG, to 0 V or other steady state level from t15-t16.

For the unselected word lines, the decrease in Vpass will cause the cells to transition from a conductive state to a non-conductive state. In particular, when the Vpass falls below a cutoff level, Vcutoff (the dotted line at t18), the channel of the cell will become cutoff, e.g., the cell will become non-conductive. When a cell becomes non-conductive, it acts as a capacitor in which the control gate is one plate and the channel is another plate. A cell becomes non-conductive when Vcg<Vcutoff or Vcg<(Vth+Vsl), where Vcg is the control gate voltage of the cell (the word line voltage), Vth is the threshold voltage of the cell and Vsl is the source line voltage which in turn is approximately the voltage at the source terminal of the cell. For a cell in the highest programmed state, e.g., the G state, the Vth can be as low as VvG (or lower due to post-programming charge loss) and as high as the Vth at the upper tail of the G state in the Vth distribution 1207 in FIG. 12. Vcutoff can therefore be as low as VvG+Vsl or as high as Vth of G state upper tail+Vsl. As the pass voltage 1905 decreases from Vcutoff to 0 V, the channel is capacitively coupled down by a similar amount, as represented by plot 1915 in FIG. 19B.

The voltage swing while the channel is cutoff will be larger when Vsl is larger. However, since Vch=Vsl, the minimum downcoupled level of Vch will be essentially independent of Vsl. For example, a 6 V swing in the word line voltage (e.g., Vcutoff=6 V) with Vsl=1 V will result in about the same minimum downcoupled level of Vch as a 5 V swing in the word line voltage (e.g., Vcutoff=5 V) with Vsl=0 V.

The plot 1912 represents the coupling up of the word line voltages from t19-t20. The coupling up is depicted as occurring relatively quickly but this is not to scale. In practice, the verify operation, e.g., from t5-t19, may consume about 100 microseconds, while the coupling up of the word line may be significantly longer, in the millisecond range such as 10 milliseconds.

FIG. 19B depicts a plot of a channel voltage (Vch) corresponding to FIG. 19A. For an unselected memory string (a string not having a cell which is programmed in the current program loop), Vch will be boosted to a level such as 8 V (not shown) during the program voltage, e.g., from t0-t4. This boosting is achieved by providing the SGD and SGS transistors of the unselected string in a non-conductive state to cause Vch to float. Vch is coupled higher due to capacitive coupling when Vpass and Vpgm are applied to the word lines. For a selected memory string (a string having a cell which is programmed in the current program loop), Vch is typically grounded as shown during the program voltage.

During the verify voltages, Vch may be initially at about 1 V, for instance, for a selected memory string. Vch is about the same as Vsl for the channels of the selected memory strings. Vsl is set based on a type of sensing which is used. Examples include negative sensing in which Vsl is about 1 V and positive sensing in which Vsl is about 0 V and a negative word line voltage is used. The techniques described herein apply regardless of the level of Vsl or the type of sensing used.

The channel is capacitively coupled down to a minimum level from t18-t19 and then begins to return to a final level of, e.g., 0 V from t19-t20. If the voltages of the word lines are allowed to float starting at t19, the voltages (plot 1912) are capacitively coupled higher by the increase in Vch. The voltages of the word lines float to a peak level of Vwl_coupled_up, e.g., about 5 V, thereby reaching the second read condition. For example, Vcutoff may be 6 V, so that there is a 6 V change in the word line voltage, e.g., 6-0 V, which is coupled to the channel. With the initial value of Vch at 1 V and a 90% coupling ratio, the minimum Vch may be about 1−6×0.9=−4.4 V, for instance. Accordingly, there is a 4.4 V increase in Vch which is coupled to the word line, e.g., control gate, of the cells. Vwl_coupled_up may be about 4.4×0.9=4 V. The voltages of the word lines are floated by disconnected the word lines from a word line driver.

FIG. 19C depicts a plot of example waveforms in a read operation, showing coupling up of a word line voltage. A read operation is similar to a verify operation as both are sensing operations and both can provide a coupling up of the word line voltages. The horizontal axis depicts time and the vertical axis depicts word line voltage, Vwl. Pass voltages 1930, 1931 and 1932 are applied to the unselected word lines from t0-3, t4-t8 and t9-t12, respectively, and have a magnitude of Vpass. The pass voltage includes an increasing portion, a portion at Vpass and a decreasing portion. A read voltage includes separate waveforms 1920 (at levels of VrA and VrE), 1921 (at levels of VrB, VrD and VrF) and 1922 (at levels of VrC and VrG) for each of the lower, middle and upper pages, respectively, consistent with FIG. 12. The read voltages are optimized for the second read condition, as an example, and are applied to the selected word line. An eight-level memory device is used in this example.

For the unselected word lines, the decrease in Vpass will cause the cells to transition from a conductive state to a non-conductive state, as discussed. The dotted line at t13 indicates when a G state cell becomes non-conductive. As the pass voltage 1932 decreases from Vcutoff to 0 V, the channel is capacitively coupled down by a similar amount, as represented by the plot 1935 in FIG. 19D. As the channel voltage increases after t14, the word line voltages are floated and are coupled higher, to Vwl_coupled_up.

Coupling up can also occur after an erase operation. At the end of the erase-verify operation, both Vsgd and Vsgs ramp down and cut off the channel when their control gate voltage falls below their Vth, e.g., 2 V (or higher in some cases). When the select gate voltage continues to decrease to 0 V, the channel potential, especially under the SGD transistor and the DD0 dummy memory cell, is down coupled due to gate-to-channel coupling. This is an unstable situation since Vbl=0 V, so that electron-hole pairs are generated in the channel. The channel potential returns to about 0 V, causing coupling up of the control gate of the dummy memory cell to about 2 V. The down coupling and associated coupling up is greater when the Vth of the select gate transistor is higher.

FIG. 19D depicts a plot of a channel voltage (Vch) corresponding to FIG. 19C. The channel is capacitively coupled down to a minimum level of Vch_min from t13-t14 and then begins to return to a final level of, e.g., 0 V from t14-t15. If the voltages of the word lines are allowed to float starting at t14, the voltages (plot 1932) are capacitively coupled higher by the increase in Vch (plot 1935). The voltages of the word lines float to a peak level of Vwl_coupled_up, as discussed.

In one implementation, an apparatus comprises: a memory string comprising a channel, a drain-end select gate transistor at a drain-end of the memory string, a selected data memory cell and a dummy memory cell adjacent to the drain-end select gate transistor; a bit line connected to the drain-end; a selected word line connected to the selected data memory cell; a dummy word line connected to the dummy memory cell; a select gate line connected to the drain-end select gate transistor; and a control circuit. The control circuit is configured to: in a pre-charge phase of a program loop, provide a first voltage on the bit line while a voltage on the select gate line is a first select gate line voltage and a voltage on the dummy word line is a first dummy word line voltage; in a program phase of the program loop, provide a program voltage on the selected word line and a second voltage on the bit line while the voltage on the select gate line is at a second select gate line voltage, lower than the first select gate line voltage, and the voltage on the dummy word line is at a second dummy word line voltage, higher than the first dummy word line voltage, wherein the second dummy word line voltage exceeds the second select gate line voltage by a first difference; and in a transition from the pre-charge phase to the program phase, provide a second difference between the voltage on the dummy word line and the voltage on the select gate line which is greater than the first difference.

In another implementation, a method comprises: charging up a channel of a memory string, the memory string comprising a drain-end select gate transistor at a drain-end of the memory string, and a dummy memory cell adjacent to the drain-end select gate transistor; during the charging, floating a voltage of the drain-end select gate transistor at a first drain-end select gate transistor voltage while providing a voltage of the dummy memory cell at a first dummy memory cell voltage; after the charging, providing a gradient in the channel between the dummy memory cell and the drain-end select gate transistor by at least one of: increasing the voltage of the dummy memory cell from the first dummy memory cell voltage to a second dummy memory cell voltage, or decreasing the voltage of the drain-end select gate transistor from the first drain-end select gate transistor voltage to a negative voltage.

In another implementation, an apparatus comprises: a memory string comprising a channel, a drain-end select gate transistor at a drain-end of the memory string, a non-data memory cell adjacent to the drain-end select gate transistor, and a data memory cell; means for pre-charging the channel via the drain-end of the memory string; means for programming the data memory cell after the channel is pre-charged;

and means for inducing a disturb of the non-data memory cell after the channel is pre-charged and before the data memory cell is programmed.

The means for pre-charging and the means for inducing may include the power control module 116, the voltage drivers 420, 430 and 440, the control circuitry 110 and the controller 122, or other logic hardware, and/or other executable code stored on a computer readable storage medium or device. Other embodiments may include similar or equivalent means.

The means for programming may include the power control module 116, the voltage drivers 420, 430 and 440, the control circuitry 110, the controller 122 and the sense blocks 51-53, or other logic hardware, and/or other executable code stored on a computer readable storage medium or device. Other embodiments may include similar or equivalent means for programming.

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:

1. An apparatus, comprising:
a memory string comprising a channel, a drain-end select gate transistor at a drain-end of the memory string, a selected data memory cell and a dummy memory cell adjacent to the drain-end select gate transistor;
a bit line connected to the drain-end;
a selected word line connected to the selected data memory cell;
a dummy word line connected to the dummy memory cell;
a select gate line connected to the drain-end select gate transistor; and
a control circuit configured to:
in a pre-charge phase of a program loop, provide a first voltage on the bit line while a voltage on the select gate line is a first select gate line voltage and a voltage on the dummy word line is a first dummy word line voltage;
in a program phase of the program loop, provide a program voltage on the selected word line and a second voltage on the bit line while the voltage on the select gate line is at a second select gate line voltage, lower than the first select gate line voltage, and the voltage on the dummy word line is at a second dummy word line voltage, higher than the first dummy word line voltage, wherein the second dummy word line voltage exceeds the second select gate line voltage by a first difference; and
in a transition from the pre-charge phase to the program phase, provide a second difference between the voltage on the dummy word line and the voltage on the select gate line which is greater than the first difference.

2. The apparatus of claim 1, wherein:
the control circuit, to provide the second difference, is configured to provide the voltage on the dummy word line at a level which is higher than the second dummy word line voltage.

3. The apparatus of claim 1, wherein:
the control circuit, to provide the second difference, is configured to provide the voltage on the select gate line at a level which is lower than the second select gate line voltage.

4. The apparatus of claim 1, wherein:
the control circuit, to provide the second difference, is configured to concurrently provide the voltage on the dummy word line at a level which is higher than the second dummy word line voltage, and provide the voltage on the select gate line at a level which is lower than the second select gate line voltage.

5. The apparatus of claim 1, wherein:
in the transition, an increase of the voltage on the dummy from the first dummy word line voltage to the second dummy word line voltage is delayed relative to a decrease of the voltage on the select gate line from the first select gate line voltage.

6. The apparatus of claim 1, wherein:
the control circuit, to provide the second difference, is configured to provide the voltage on the select gate line at a negative level which is lower than the second select gate line voltage.

7. The apparatus of claim 1, wherein:
the drain-end select gate transistor is in a conductive state during the pre-charge phase and the program phase.

8. The apparatus of claim 1, wherein:
the second voltage on the bit line is lower than the first voltage on the bit line.

9. The apparatus of claim 8, wherein:
in the transition, a decrease from the first voltage to the second voltage is delayed relative to a decrease of the voltage on the select gate line from the first select gate line voltage.

10. The apparatus of claim 1, wherein:
the program loop occurs during a program operation involving the selected word line; and
in a subsequent program operation involving another word line, a transition from the pre-charge phase to the program phase does not provide a difference between the voltage on the dummy word line and the voltage on the select gate line which is greater than a difference by which the second dummy word line voltage exceeds the second select gate line voltage in a program phase.

11. The apparatus of claim 1, wherein:
the program loop occurs during a program operation involving the selected word line; and
in another program loop of the program operation involving the selected word line, a transition from the pre-charge phase to the program phase does not provide the second difference between the voltage on the dummy word line and the voltage on the select gate line.

* * * * *